(12) United States Patent
Dasgupta

(10) Patent No.: US 7,764,122 B1
(45) Date of Patent: *Jul. 27, 2010

(54) DUAL STAGE SOURCE/SINK AMPLIFIER CIRCUIT WITH QUIESCENT CURRENT DETERMINATION

(75) Inventor: Uday Dasgupta, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/337,955

(22) Filed: Dec. 18, 2008

Related U.S. Application Data

(63) Continuation of application No. 11/789,170, filed on Apr. 24, 2007, now Pat. No. 7,474,153.

(60) Provisional application No. 60/802,703, filed on May 23, 2006, provisional application No. 60/808,280, filed on May 25, 2006.

(51) Int. Cl.
*H03F 3/45* (2006.01)

(52) U.S. Cl. ...................................... 330/255; 330/264
(58) Field of Classification Search ................. 330/255, 330/264, 98, 310, 150
See application file for complete search history.

(56) References Cited

U.S. PATENT DOCUMENTS

| | | | | |
|---|---|---|---|---|
| 4,963,837 | A | * 10/1990 | Dedic | ......................... 330/264 |
| 5,606,281 | A | 2/1997 | Gloaguen | |
| 5,841,321 | A | 11/1998 | Ivanov et al. | |
| 6,255,909 | B1 | * 7/2001 | Muza | ......................... 330/264 |
| 6,317,000 | B1 | 11/2001 | Ivanov et al. | |
| 6,836,186 | B2 | * 12/2004 | Lee et al. | ..................... 330/264 |

* cited by examiner

*Primary Examiner*—Henry K Choe

(57) ABSTRACT

An amplifier circuit includes a first stage to generate a first stage output based on a signal input and a control input. A second stage in communication with the first stage output and the control input. The second stage includes a first current source driver operable in a constant current source mode or a driver mode. The first current source driver operates in either the constant current source mode or the driver mode based on the signal input and the control input.

27 Claims, 15 Drawing Sheets

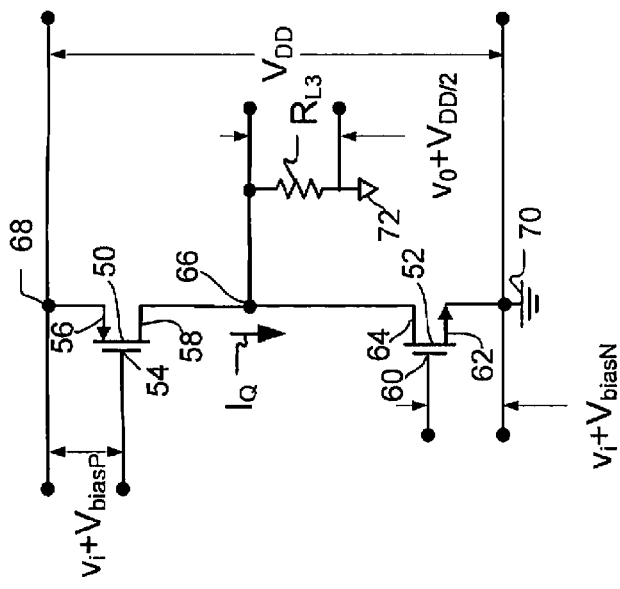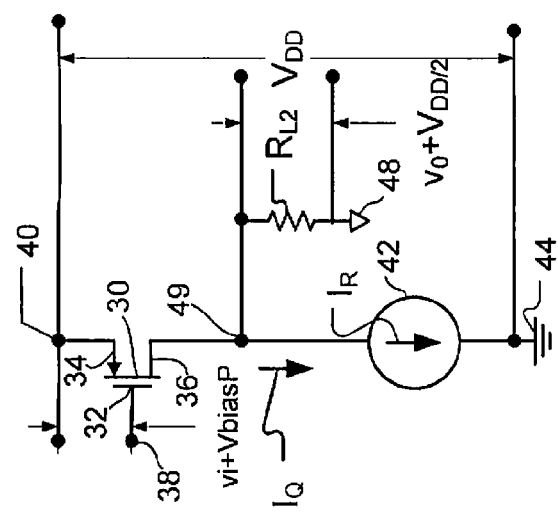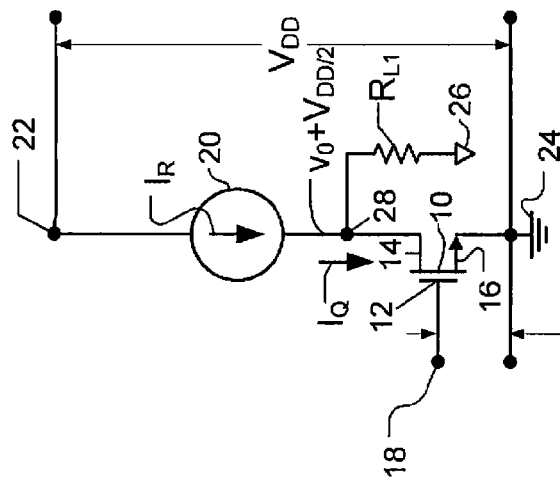

DUAL STAGE SOURCE/SINK AMPLIFIER CIRCUIT WITH QUIESCENT CURRENT DETERMINATION

CROSS-REFERENCE TO RELATED APPLICATIONS

This application is a continuation of U.S. patent application Ser. No. 11/789,170, filed Apr. 24, 2007, which claims the benefit of U.S. Provisional Application No. 60/802,703, filed May 23, 2006 and of U.S. Provisional Application No. 60/808,280, filed May 25, 2006. The disclosures of the above applications are incorporated herein by reference.

FIELD

The present disclosure relates to amplifiers, and more particularly to the sinking and sourcing performance of the output stage of an amplifier.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Operational amplifiers are often used in signal processing applications, such as filter circuits, amplifier circuits, driver circuits, etc. Referring now to FIGS. 1A-1C, a class-A output stage with an NMOS driver, a class-A output stage with a PMOS driver, and a class-AB output stage are shown, respectively.

The first class-A output stage of FIG. 1A includes an NMOS transistor 10 that has a gate 12, a drain 14, and a source 16. The gate 12 is connected to an input terminal 18 that is supplied with an input signal voltage $v_i$ and a DC bias voltage $V_{biasN}$. The drain 14 is connected to a first current source 20, which is in turn connected to a voltage supply terminal 22 having potential $V_{DD}$. The source 16 is connected to ground 24. A first load resistance $R_{L1}$ is coupled between the drain 14 and an analog ground terminal 26 having a voltage potential that is one half of the voltage supply $V_{DD}$ or $V_{DD}/2$. Voltage output of the transistor 10 is taken from the drain 14 at an output terminal 28 across the load resistance $R_{L1}$. The potential of the output terminal 28 is $v_o+V_{DD/2}$, where $v_o$ is the output signal voltage.

The second class-A output stage of FIG. 1B includes a PMOS transistor 30 having a gate 32, a source 34, and a drain 36. The second gate 32 is connected to an input terminal 38 that is supplied with the input signal voltage $v_i$ and the DC bias voltage $V_{biasP}$. The source 34 is connected to a voltage supply terminal 40. The drain 36 is connected to a second current source 42, which is in turn connected to ground 44. A second load resistance $R_{L2}$ is coupled between the drain 36 and an analog ground terminal 48. Voltage output of the transistor 30 is taken from the drain 36 at an output terminal 49 across the load resistance $R_{L2}$. The potential of the output terminal 49 is $v_o+V_{DD}/2$.

The class-AB output stage of FIG. 1C includes a PMOS transistor 50 and an NMOS transistor 52. The PMOS transistor 50 has a gate 54, a source 56, and a drain 58. The NMOS transistor 52 has a gate 60, a source 62, and a drain 64. The gate 54 is supplied with the input signal voltage $v_i$ and the DC bias voltage $V_{biasP}$. The gate 60 is supplied with the input signal voltage $v_i$ and the DC bias voltage $V_{biasN}$. The drains 58 and 64 are connected directly to each other via an output terminal 66. The source 56 is connected to a voltage supply terminal 68. The source 62 is connected to ground 70. A third load resistance $R_{L3}$ is connected between the output terminal 66 and an analog ground terminal 72. The potential of the output terminal 66 is $v_o+V_{DD/2}$.

The quiescent current $I_Q$ for the above output stages is defined as the current through each of the output stages in absence of input and output AC signals $v_i$ and $v_o$. The quiescent current $I_Q$ for the class-A drivers of FIGS. 1A and 1B is determined solely by the current $I_R$ of the current sources 20 and 42 such that the quiescent current $I_Q$ is equal to the current $I_R$. The DC bias voltages $V_{biasN}$ and $V_{biasP}$ are automatically adjusted such that the NMOS and PMOS transistors carry the current $I_R$ when the negative feedback loops (not shown) across the amplifiers are closed.

The class-AB output stage provides improved performance over the class-A output stages. The first class-A output stage can sink, but cannot source more than the quiescent current $I_Q$ into the load resistance RL1. The second class-A output stage can source, but cannot sink more than the quiescent current $I_Q$ into the load resistance $RL_2$. Although the class-AB output stage is capable of sinking and sourcing more than the quiescent current $I_Q$, the class-AB output stage has other associated disadvantages and limitations, some of which are described below.

The class-AB output stage is also more efficient than the class-A output stages, as the quiescent current $I_Q$ value associated with the class-AB stage can be considerably smaller than that of the class-A output stages. However, the quiescent current $I_Q$ for the class-AB output stage cannot be easily determined. The DC bias voltages $V_{biasN}$ and $V_{biasP}$ have to be adjusted to the correct values so that the quiescent current $I_Q$ is precisely determined. Also, this adjustment cannot be done by simply closing the negative feedback loop of the operational amplifier, as the loop does not contain information for determining the appropriate quiescent current $I_Q$ value required. Therefore, when the negative feedback loop is closed the quiescent current $I_Q$ may be set to any arbitrary value. As such, to provide the appropriate quiescent current $I_Q$, the design of a class-AB output stage is more complicated compared to that of a class-A output stage.

In general, there are two methods that are used in the design of a class-AB output stage with deterministic values of the quiescent current $I_Q$. The first method includes the use of an additional feedback loop which senses the quiescent current $I_Q$, compares it against a reference current $I_R$ and corrects the bias voltages $V_{biasN}$ and $V_{biasP}$ such that the quiescent current $I_Q$ is equal to a positive constant k multiplied by the reference current $I_R$. This approach introduces increased complexity and often leads to a three-stage amplifier, which is difficult to design.

The second method includes determining the bias voltages $V_{biasN}$ and $V_{biasP}$ of the class-AB output stage separately using two separate translinear loops. The first loop is used to set a first quiescent current $I_Q$ of the PMOS transistor to $kI_R$. The second loop is used to set a second quiescent current $I_Q$ of the NMOS transistor also to $kI_R$. A disadvantage of this method is that mismatches occur in the set quiescent current $I_Q$ values for the NMOS and PMOS transistors, since they are determined by two different circuits. The mismatched values result in increased input reference offset voltage for the amplifier. Thus, although the second method is simpler than the first, it suffers from higher input offset voltages and to changes in the quiescent current $I_Q$ values with process, temperature and power supply voltage variations. Also, the second method is not suitable for lower power supply voltages because of the higher voltage of operation required by the translinear loops.

In addition, both of the class-AB methods described above are high speed application limited. The loops that maintain the quiescent current $I_Q$, for both of the methods, are limited in their ability to track fast changing signals. For this reason, a disturbance in the amplifier exists due to the bias voltage $V_{biasN}$ being greater and/or the bias voltage $V_{biasP}$ being less than normal. The disturbance remains until the loops have settled properly. This results in a high shunt current $I_{sH}$ that flows from the voltage supply terminal to ground for the period of the disturbance. The current $I_{sH}$ may be significantly greater than the quiescent current $I_Q$, thus reducing efficiency.

SUMMARY

An amplifier circuit is provided and includes a first stage that receives a signal input and a control input and that generates first stage outputs. A second stage that communicates with the first stage and the control input and that includes a current source drivers. Each of the current source drivers have a constant current source mode and a driver mode. The constant current source mode and the driver mode are selected based on the signal input and the control input. A comparator circuit compares current through the current source drivers with a reference current. A control circuit generates the control input based on the comparison.

In other features, the first stage cancels input signal variations based on the control input.

In still other features, the first stage averages differential input currents associated with the signal input based on the control input.

In yet other features, the first stage provides a constant bias current to the current source drivers based on the signal input and the control input.

In other features, the second stage is directly connected to the first stage.

In further features, the second stage includes a first current source driver that communicates with the first stage outputs and sources current when in the driver mode. A second current source driver communicates with the first stage outputs and sinks current when in the driver mode. In other features, the first stage includes a first amplifier that communicates with the first current source driver. A second amplifier may communicate with the second current source driver. In yet other features, the first stage includes a first converter that communicates with and that at least partially controls operation of the first current source driver. A second converter communicates with and at least partially controls operation of the second current source driver.

In additional features, the first stage includes a switch that selects the constant current source mode and the driver mode.

In other features, a first current source driver and a second current source driver are included. The first stage activates the first current source driver and simultaneously deactivates the second current source driver. In other features, the first current source driver is in a constant current source mode when the second current source driver is in a driver mode. In yet other features, the first current source driver is in a driver mode when the second current source driver is in a constant current source mode. In still other features, the first stage enables current flow in the first current source driver and simultaneously disables current flow in said second current source driver.

In other features, a first comparator circuit that has a first comparator output and a second comparator circuit that has a second comparator output are included. A first current source driver communicates with the first comparator circuit and operates based on the first comparator output. A second current source driver communicates with the second comparator circuit and operates based on the second comparator output. In other features, the first current source driver operates in a constant current sourcing mode based on the first comparator output. The second current source driver operates in a constant current sinking mode based on the second comparator output.

In still other features, the comparator circuit includes selectable reference current supplies.

In other features, the control circuit comprises a flip flop that communicates with the comparator circuit and has a circuit output. The current source drivers operate in response to the circuit output.

In further features, the control circuit includes a gate that communicates with the comparator circuit. A flip flop communicates with the gate and has a circuit output. The current source drivers operate based on the circuit output.

A method of operating an amplifier circuit is provided and includes receiving a signal input and a control input and generating first stage outputs. A constant current source mode and a driver mode associated with current source drivers are selected based on the signal input and the control input. Current through the current source drivers is compared with a reference current. The control input is generated based on the comparison.

In other features, input signal variations are canceled based on the control input.

In other features, the differential input currents associated with the signal input are averaged based on the control input.

In further features, a constant bias current is provided to the current source drivers based on the signal input and the control input.

In other features, a first current source driver activates and simultaneously deactivates a second current source driver. In further features, the first current source driver is operated in a constant current source mode when the second current source driver is in a driver mode. In still other features, the first current source driver is in a driver mode when the second current source driver is in a constant current source mode. In yet other features, the current flow is enabled in the first current source driver and simultaneously disabled in the second current source driver.

In still other features, a first current source driver is operated in a constant current sourcing mode based on a first comparator output and a second current source driver is operated in a constant current sinking mode based on a second comparator output.

An amplifier circuit is also provided that includes first stage means for receiving a signal input and a control input and for generating first stage outputs. Second stage means communicates with the first stage means and the control input and includes current source driver means. Each of the current source driver means has a constant current source mode and a driver mode. The constant current source mode and the driver mode are selected based on the signal input and the control input. Comparator means compares current through the current source driver means with a reference current. Control means generates the control input based on the comparison.

In other features, the first stage means cancels input signal variations based on the control input.

In still other features, the first stage means averages differential input currents associated with the signal input based on the control input.

In other features, the first stage means provides a constant bias current to the current source driver means based on the signal input and the control input.

In additional features, the second stage means is directly connected to the first stage means.

In other features, the second stage means includes first current source driver means communicates with the first stage outputs and sources current when in the driver mode. Second current source driver means communicates with the first stage outputs and sinks current when in the driver mode. In other features, the first stage means includes first amplifying means that communicates with the first current source driver means. Second amplifying means communicates with the second current source driver means. In still other features, the first stage means includes first converting means that communicates with and at least partially controls operation of the first current source driver means. Second converting means communicates with and at least partially controls operation of the second current source driver means.

In other features, the first stage means includes switching means for selecting the constant current source mode and the driver mode.

In other features, first current source driver means and second current source driver means are included. The first stage means activates the first current source driver means and simultaneously deactivates the second current source driver means. In still other features, the first current source driver means is in a constant current source mode when the second current source driver means is in a driver mode. In yet other features, the first current source driver means is in a driver mode when the second current source driver means is in a constant current source mode. In further features, the first stage means enables current flow in the first current source driver means and simultaneously disables current flow in the second current source driver means.

In other features, first comparator means that has a first comparator output and second comparator means that has a second comparator output are included. First current source driver means communicates with the first comparator means and operates based on the first comparator output. Second current source driver means communicates with the second comparator means and operates based on the second comparator output.

In other features, the first current source driver means operates in a constant current sourcing mode based on the first comparator output. The second current source driver means operates in a constant current sinking mode based on the second comparator output.

In other features, the comparator means includes selectable reference current supplies.

In additional features, the control means includes flip flop means that communicates with the comparator means and has a circuit output. The current source driver means operate in response to the circuit output.

In other features, the control means includes gate means that communicates with the comparator means. Flip flop means communicates with the gate means and has a circuit output. The current source driver means operates based on the circuit output.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1A is a schematic diagram of a class-A output stage of an amplifier having an NMOS driver according to the prior art;

FIG. 1B is a schematic diagram of a class-A output stage of an amplifier having an PMOS driver according to the prior art;

FIG. 1C is a schematic diagram of a class-AB output stage of an amplifier according to the prior art;

DETAILED DESCRIPTION

Figure 2:
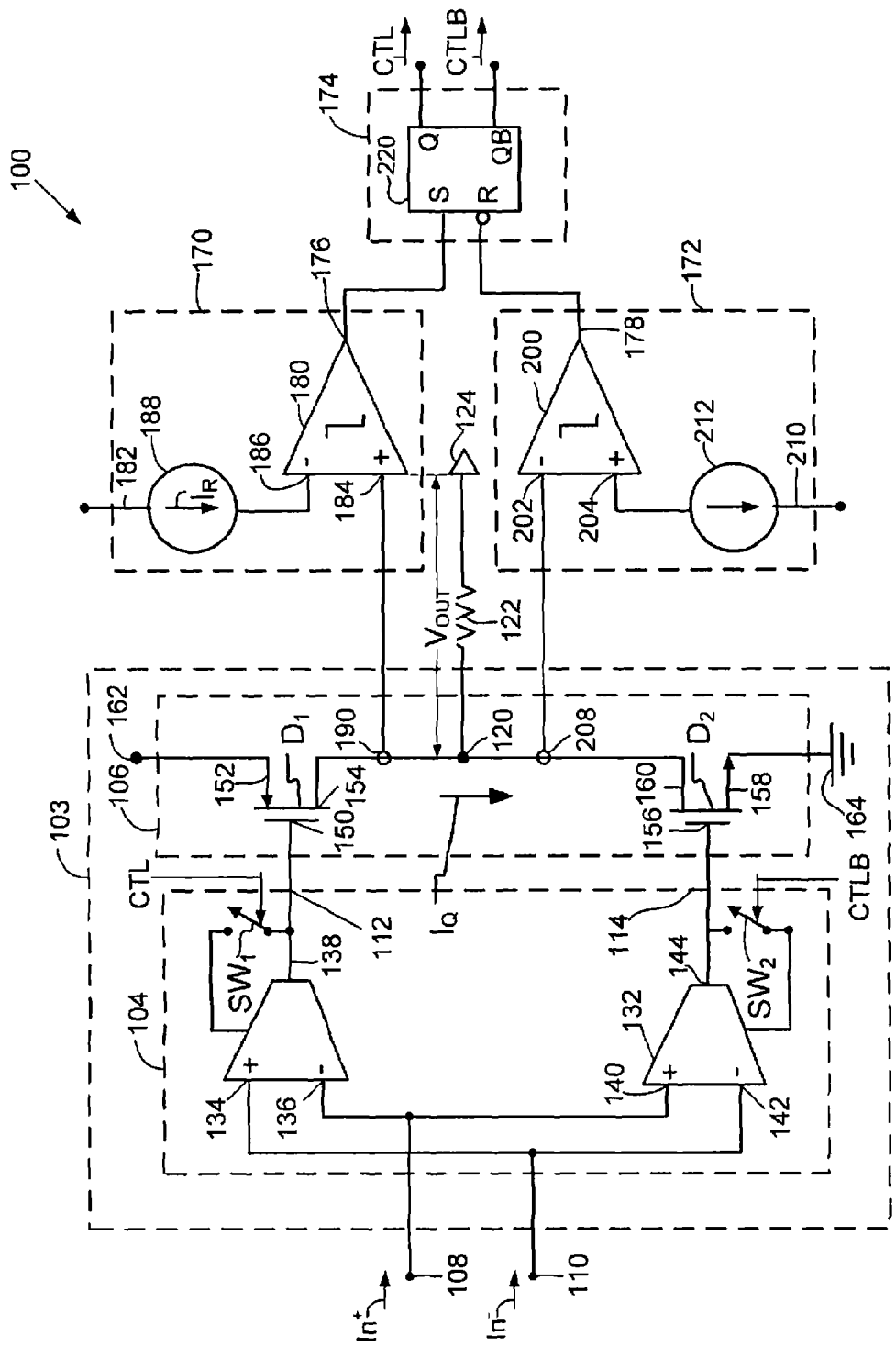
FIG. 2 is a schematic diagram of an amplifier circuit according to an embodiment of the present disclosure.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Also, the amplifiers and amplifier circuits described herein may be used in many different applications, as will be readily apparent to one skilled in the art in view of the below description and accompanying Figures. The amplifiers and amplifier circuits may be used as or in a voice coil for power combination purposes and/or other purposes, some of which are described below. The embodiments and applications described below are provided as examples only and are thus not all inclusive.

In addition, the terms "activate" and "deactivate" may refer to the powering or switching ON and OFF of a device, the enabling and disabling of current flow through a device, or the like. Although particular example embodiments are described herein, the devices, components, stages, comparators, converters, amplifiers, and other electronic and electrical devices described herein may be configured to be activated or deactivated via a change in current, voltage, or resistance.

Furthermore, the terms "high" and "low" may refer to the common digital voltage convention of approximately 5V and 0V or may refer to some other selected, set or designed digital or analog voltage levels. The term "high" may simply refer to a set level or value that is greater than another set level or value associated with the term "low". The amplifier circuits described herein are compatible with low-voltage operation, which may also refer to the common digital voltage convention.

Moreover, the quiescent current $I_Q$ of a device is defined as the current through the output stage of a circuit absence of input and output AC signals.

Prior art class-AB output driver circuits are complex due to the circuitry to maintain a controlled quiescent current. The quiescent current is maintained while high short-circuit currents are contained through the use of driver transistors. This occurs when fast changing signals are handled. One embodiment of the present disclosure, provides two driver transistors that are controlled by fast changing digital control signals. At any point in time, one of the transistors is configured to work as a source/sink driver while the other is configured to work as a constant current source. Thus, quiescent current is based on the current in the constant current source, which is similar to a class-A output stage. However, unlike a class-A output stage, the roles of the transistors are reversed automatically when there is a change from a current source mode to a sink mode and vice versa. This takes place when the currents in the transistors are close to the quiescent current, which can be a small fraction of the peak current. Thus, high short-circuit current occurrences are minimized or nonexistent.

Figure 3:
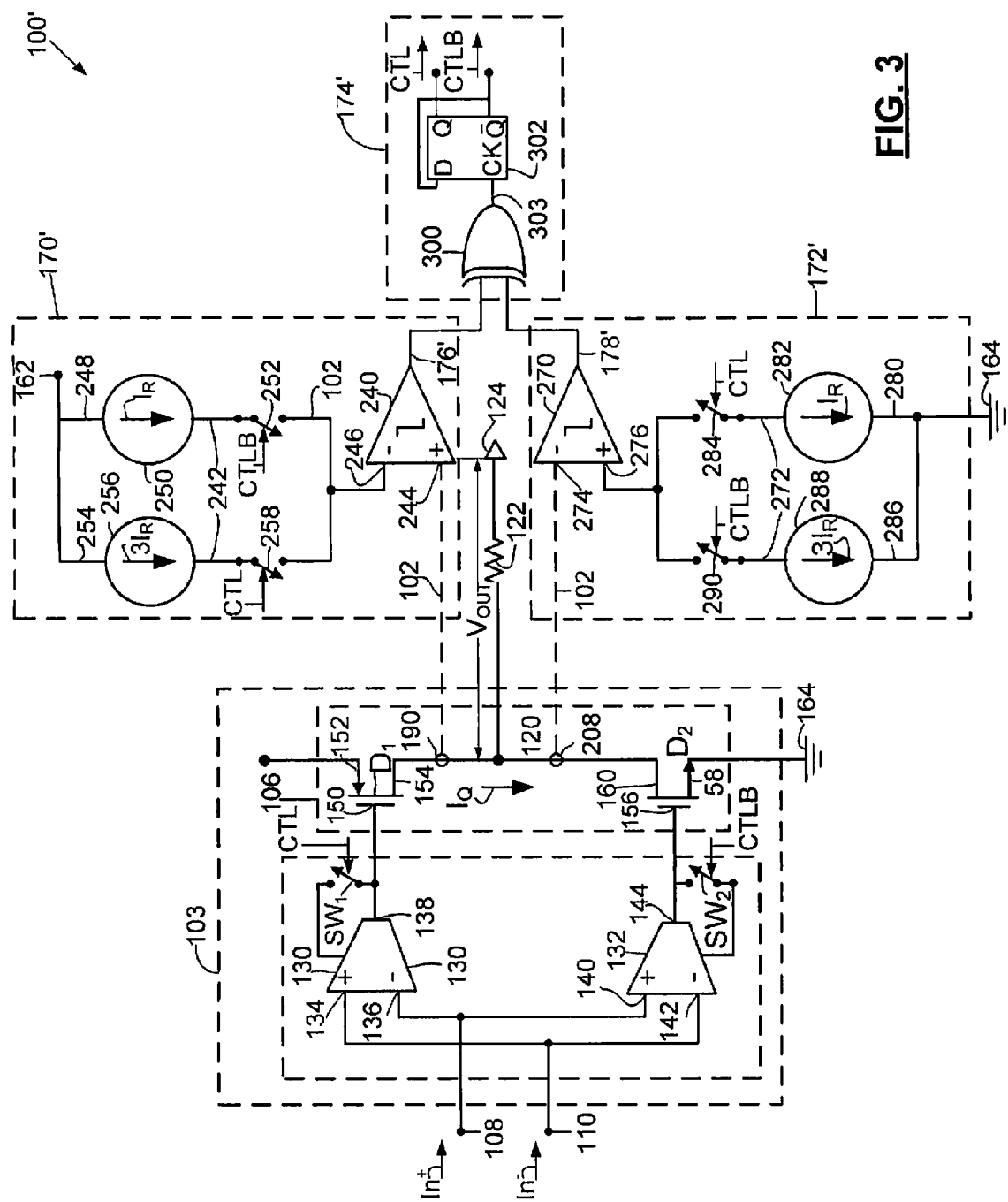
FIG. 3 is a schematic diagram of an amplifier circuit according to another embodiment of the present disclosure.

Referring to FIGS. 2-3, schematic diagrams of a first amplifier circuit 100 and a second amplifier circuit 100' are shown. The dashed lines 102 represent current paths. The amplifiers circuits 100 and 100' include an amplifier 103 that has a first or input stage 104, which is in communication with a second or output stage 106. The input stage 104 controls operation of the output stage 106. The input stage 104 has signal input terminals 108, 110, which receive respective voltages In+ and In−, and input stage output terminals 112, 114. The output stage 106 has a disabled mode, a current sourcing mode, and a current sinking mode. Based on the input stage outputs 112, 114, the output stage 106 allows passage of a quiescent current $I_Q$ through the channels of the output stage 106 across an amplifier output terminal 120 or sources current to or sinks current through a load resistance 122, such as a load resistor. As shown, the load resistance 122 is connected between the amplifier output terminal 120 and the analog ground terminal 124.

The input stage 104 also includes a first converter 130 and a second converter 132. The converters 130, 132 may be in the form of operation transimpedance amplifiers (OTAs) or voltage-to-current converters, as shown. The first converter 130 may be a p-type OTA and the second converter 132 may be an n-type OTA. The first converter 130 has a non-inverting input 134, an inverting input 136, and a first converter output 138. The second converter 132 has a non-inverting input 140, an inverting input 142, and a second converter output 144. The non-inverting input 134 and the inverting input 142 are coupled to the input terminal 110. The inverting input 136 and the non-inverting input 140 are coupled to the input terminal 108. A first control switch $SW_1$ is connected to the first converter output 138 and is in a feedback arrangement with the first converter 130. A second control switch $SW_2$ is connected to the second converter output 144 and is in a feedback arrangement with the second converter 132.

The output stage 106 includes a first current source driver $D_1$ and a second current source driver $D_2$. The drivers $D_1$, $D_2$ may operate in a constant current mode or a driver mode. The driver mode is associated with either the current sourcing mode or the current sinking mode, depending on the enabled driver. This is further described below. For example purposes, the drivers $D_1$, $D_2$ are shown as a p-channel metal oxide semiconductor field effect transistor (PMOSFET) and an n-channel MOSFET, respectively. The first driver $D_1$ includes a gate 150, a source 152, and a drain 154. The second driver $D_2$ includes a gate 156, a source 158, and a drain 160. The gate 150 is connected to the converter output 138 and the gate 156 is connected to the converter output 144. The source 152 is connected to a voltage supply terminal 162 having a voltage potential of $V_{DD}$. The source 158 is connected to ground 164 or to some other return terminal, such as one having a potential of zero volts. The drains 154, 160 are connected to the amplifier output terminal 120.

The amplifier circuits 100, 100' also include first comparator circuits 170, 170', second comparator circuits 172, 172' and feedback control circuits 174, 174'. The first comparator circuits 170, 170' compare a current sampled through the first driver $D_1$ and a reference current. The second comparator circuits 172, 172' compare current through the second driver $D_2$ and a reference current. Comparator outputs 176, 176', 178, 178' of the comparator circuits 170, 170', 172, 172', are used in operation of the switches $SW_1$, $SW_2$, respectively.

Referring to FIG. 2, the first comparator circuit 170 has a first comparator 180. The first comparator 180 may be a p-channel current comparator and has the non-inverting current sample input 184, the inverting current reference input 186, and the comparator output 176. The sample input 184 is connected to the drain 154 via a first scaling device 190 that taps the current passing through the first driver $D_1$ with a scale factor of 2/k, where k is a positive integer. The reference input 186 is coupled to a reference channel 182. Although any number of current reference channels may be connected to the reference input 186, only one is shown in FIG. 2. See FIG. 3 for an example of multiple current channels. The reference channel 182 has a first current source 188 that has an associated current $I_R$.

The second comparator circuit 172 likewise has a second comparator 200. The second comparator 200 may be an n-channel current comparator and has the inverting current sample input 202, the non-inverting current reference input 204, and the comparator output 178. The sample input 202 is connected to the drain 160 via a second scaling device 208 that taps the current passing through the second driver $D_2$ with a scale factor of 2/k. The reference input 204 is coupled to a reference channel 210. Although any number of current channels may be connected to the reference input 204, only one is shown. See FIG. 3 for an example of multiple current channels. The reference channel 210 has a second current source 212 that has an associated current $I_R$.

The tapping of the currents passing through the channels of the drivers $D_1$, $D_2$ allows for precise determination of the quiescent current $I_Q$. Also, although the reference current $I_R$ is used in the provided example with respect to the comparators 180, 200, other reference currents may be used.

The logic circuit includes a flip flop 220, such as an SR-flip flop, as commonly known in the art. In the embodiment shown, the set and reset inputs S, R of the flip flop 220 receive and are connected to the comparator outputs 176, 178, respectively. The logic circuit or flip flop outputs Q and QB of the flip flop 220 are connected to and control the operation of the switches $SW_1$, $SW_2$ and are used to select active modes of the drivers $D_1$, $D_2$. The output Q is connected to the switch $SW_1$ and the output QB is connected to the switch $SW_2$.

Referring now to FIG. 3, the first comparator circuit 170' has a first comparator 240 and one or more parallel current reference branches or channels 242. The first comparator 240 may be a p-channel current comparator and has the non-inverting current sample input 244, the inverting current reference input 246, and the first comparator output 176'. The sample input 244 is connected to the drain 154 via the scaling device 190 that taps the current passing through the first driver $D_1$ with a scale factor of 2/k. The reference input 246 is coupled to the reference channels 242. Although any number of current channels may be connected to the current reference input 246, two are shown. The first current channel 248 includes a first current source 250 that is in series with a first channel switch 252 and has an associated current $I_R$. The second current channel 254 includes a second current source 256 that is in series with a second channel switch 258 and has an associated current $3I_R$. The current sources 250, 256 are connected between the associated switches 252, 258 and the voltage supply terminal 162. The switches 252, 258 are connected between the associated current sources 250, 256 and the reference input 246.

The second comparator circuit 172' likewise has a second comparator 270 and one or more current reference channels 272. The second comparator 270 may be a n-channel current comparator and has the inverting current sample input 274, the non-inverting current reference input 276, and the second comparator output 178'. The sample input 274 is connected to the drain 160 via the scaling device 208 that taps the current passing through the second driver $D_2$ with a scale factor of 2/k. The reference input 276 is coupled to the reference channels 272. Although any number of current channels may be connected to the reference input 276, two are shown. The first current channel 280 includes a first current source 282 that is in series with a first channel switch 284 and has an associated current $I_R$. The second current channel 286 includes a second current source 288 that is in series with a second channel switch 290 and has an associated current $3I_R$. The current sources 282, 288 are connected between the associated switches 284, 290 and ground 164. The switches 284, 290 are connected between the associated current sources 282, 288 and the reference input 276. Although reference currents $I_R$ and $3I_R$ are used in the provided example, other reference currents may be used.

The control circuit 174' includes a logic gate 300, such as an exclusive or gate, and a flip flop 302, such as a D-flip flop. The logic gate 300 receives and is connected to the comparator outputs 176', 178'. The gate output 303 is connected to the clock input CK of the flip flop 302. Non-inverting and inverting logic circuit or flip flop outputs Q, $\overline{Q}$ are used to select active modes of the drivers $D_1$, $D_2$ and to select reference current supplied to the comparators 240, 270. The non-inverting flip flop output Q is connected to and controls operation of the switches $SW_1$, 258, 284 via a control signal output CTL, which is a control input to the first stage 104. The inverting output $\overline{Q}$ is connected to and controls operation of the switches SW2, 252, 290 via a control signal output CTLB, which is also a control input to the first stage.

Referring to FIGS. 2-3, in use, the amplifier 103 drives the load resistance 122. The converters 130, 132 operate in one of two active modes depending on the positions of the switches $SW_1$, $SW_2$. The switches $SW_1$, $SW_2$ are closed when the respective control signals are high.

As a first example, when the second switch $SW_2$ is closed and the first switch $SW_1$ is open then the second converter 132 blocks any input signal In+, In− to the second driver $D_2$, which results in the second driver $D_2$ carrying a constant current $kI_R$ across the source 158 and the drain 160. The constant k is a positive integer. The first converter 130 passes the input signals In+, In− to the first driver $D_1$. The output stage 106 operates to source current into the load resistance 122.

As a second example, when the second switch $SW_2$ is open and the first switch $SW_1$ is closed then the first converter 130 blocks the input signals In+, In− from passing to the first driver $D_1$. As such, the first driver $D_1$ carries a constant current $kI_R$. On the other hand, the second converter 132 passes the input signals In+, In− to the second driver $D_2$. In this way, the output stage 106 operates to source current to the load resistance 122.

Since the switches $SW_1$, $SW_2$ are operated using complementary logic signals, designated as CTL, CTLB, where CTLB is the inversion of CTL, the output stage 106 can operate in either a sinking or a sourcing mode depending on whether the control signals CTL, CTLB are high or low. Regardless of the state of the control signals CTL, CTLB, the quiescent current $I_Q$ is equal to $kI_R$.

In another embodiment, the output stage 106 is operated in a sinking mode or a sourcing mode when a desired sinking or sourcing current level is greater than $kI_R/2$ through the load resistance 122. For the stated embodiment, when source/sink requirements are less than $kI_R/2$, any of the above operating modes or configurations may be chosen.

Looking at the operation of the comparator circuits 170, 172, the scaling devices 190, 208 tap the drains 154, 160 and provide a scaled current level to the comparators 180, 200. For example, the drain currents may be scaled down by a ratio of k:2, where k is a positive integer.

Referring to FIG. 2, to illustrate source/sink requirements greater than $kI_R/2$, the following example is provided when the control signal CTL is high, the amplifier 103 is under a closed loop condition and no input signal is applied. In this state, the first driver $D_1$ performs as a current source and the second driver $D_2$ performs as a driver. The amplifier output 120 is at then analog ground potential, such as $V_{DD}/2$. The current through the load resistance 122 is zero and $I_Q=kI_R$. The reference current of the second comparator 200 is $I_R$ and its sampled input current, including a scale factor of 2/k, is $(2/k)*I_Q=2I_R$. Therefore, the comparator output 178, which is used to reset the flip flop 220, is low. Similarly, the reference current of the comparator 180 is $I_R$ while its sampled input current is $2I_R$. Therefore, the comparator output 176 is high. The flip flop 220 is designed to be set by a low level at input S and reset by a high level at input R. Since input S is high and input R is low, the flip flop 220 is in a holding state with the control signal CTL high.

Now in the instance when an input signal is applied and the polarity of the input signal is such that the amplifier output 120 decreases below the analog ground 124, sinking current from the load resistance 122. The sinking current level rises from the quiescent current $I_Q$ to an amount required, which may be many times that of the quiescent current $I_Q$. During this time, the outputs S, R are unchanged as the state of the comparator inputs 184, 202 remain the same. Therefore, the control signal CTL remains high.

Continuing from the same example, when the input signal has changed its polarity and the amplifier output 120 increases above the analog ground 124, sourcing current through the load resistance 122. Current through the second driver $D_2$ reduces from the quiescent current $I_Q$ since the second driver $D_2$ supplies the quiescent current $I_Q$, which is shared between the load resistance 122 and the second driver $D_2$. When the current through the second driver $D_2$ decreases below $I_Q/2$, which is equal to $kI_R/2$, the comparator input 202 reduces below $(2/k)*(I_Q/2)$, which is equal to the reference current $I_R$ and input R is high. This resets the flip-flop 220 and the control signal CTL is low. As a result, the second switch $SW_2$ closes and the first switch $SW_1$ opens. Then the second driver $D_2$ performs as a constant current source and the first driver $D_1$ performs as a driver. The current through the second driver $D_2$ increases up to the quiescent current $I_Q$ and the comparator input 202 to $2I_R$. Therefore, the input R decreases back to a low state. The current in the first driver $D_1$ increases above the quiescent current $I_Q$, since it supplies the current in the load resistance 122 and the second driver $D_2$. The input current to the comparator 180 increases above $(2/k)*I_Q$, which is equal to $2I_R$. Therefore, the input S remains high and the flip-flop 220 remains in a holding state with the control signal CTL low.

In a similar manner, the control signal CTL remains low for the period the current in the first driver $D_1$ is higher than the quiescent current $I_Q$. The current in the first driver $D_1$ may be several times greater than the quiescent current $I_Q$. However when the current in the first driver $D_1$ drops below $I_Q/2$, which is equal to $kI_R/2$, the input S transitions to a low state. This sets the flip-flop 220 causing the control signal CTL to transition to a high state. Now the second driver $D_2$ is the driver and the first driver $D_1$ is the current source. The current in $D_1$ increases up to $I_Q$ and the comparator input 184 to $2I_R$ Therefore, input S returns to a high state while the input R remains low, causing the flip-flop 220 to be in a holding state with the control signal CTL in a high state. It is also clear that when the current to be sourced into or sinked from the load resistance 122 is less than $kI_R/2$, the control signal CTL may be at any one state, thereby, selecting any one of $D_1$, $D_2$ as the driver and the other as a constant current source.

Referring to FIG. 3, when the control signal CTL is high, the amplifier 103 is under closed loop condition and no input signal is applied. Then first driver $D_1$ performs as a current source and the second driver $D_2$ performs as a driver. The amplifier output 120 is at the potential of the analog ground 124, the current through the load resistance 122 is zero and the quiescent current $I_Q$ is equal to $kI_R$. The reference current of the comparator 270 is selected to be the reference current $I_R$ and the comparator input current is $(2/k)*I_Q$, which is equal to $2I_R$. Therefore the comparator output 178' is low. Similarly, the reference current of the comparator 240 is selected to be $3I_R$ while its input current is $2I_R$. Therefore, the comparator output 176' is low. The EXOR gate output 303 is low. The flip-flop 302 is configured as a toggle flip-flop that generates the control signals CTL, CTLB as outputs and is clocked by the rising edge of the gate output 303.

When an input signal is applied and the polarity of the input signal is such that the amplifier output 120 transitions lower than analog ground and current is sinked from the load resistance 122 into the analog ground 124. The second driver $D_2$ sinks the current and the level of that current rises from the quiescent current $I_Q$ to the appropriate amount, which may be many times that of the quiescent current $I_Q$. During this time, the comparator outputs 176', 178' do not change as the conditions at the comparator inputs 244, 274 remain the same. Therefore, the control signal CTL remains high.

When the input signal changes polarity and the amplifier output 120 transitions higher than the analog ground 124 and current is sourced into the load resistance 122. Current through the first driver $D_1$ reduces from the quiescent current $I_Q$, since the second driver $D_2$ supplies the quiescent current $I_Q$, which is shared between the load resistance 122 and the second driver $D_2$. When the current through the second driver $D_2$ drops below $I_Q/2$, which is equal to $=kI_R/2$, the comparator input 274 reduces just below $(2/k)*(I_Q/2)$, which is equal to $I_R$. The comparator output 178' transitions high. The comparator output 176' remains low since the current through the first driver $D_1$ remains constant at $I_Q$. This causes the gate output 303 to transition high and thus, in turn, triggers the flip-flop 302 to toggle, and the control signal CTL transitions to a low state. As a result, the second switch $SW_2$ closes and the first switch $SW_1$ opens. Then the second driver $D_2$ performs as a current source and the first driver $D_1$ performs as the driver. The current through the second driver $D_2$ increases up to $I_Q$ and the comparator input 274 increases to $2I_R$. The reference current for the second comparator 270 is selected to be $3I_R$, as a result the comparator output 178' remains high. The current in the first driver $D_1$ increases above $I_Q$. The input current to the first comparator 240 increases above $(2/k)*I_Q$, which is equal to $2I_R$. The reference current for the first comparator 240 is selected to be the reference current $I_R$ and, therefore the comparator output 176' transitions high. This causes the EXOR gate output 303 to return to a low state, but the flip-flop 302 does not toggle and waits for the next trigger.

In a similar manner, the control signal CTL remains low for the period the current in the first driver $D_1$ is higher than $I_Q$, which may be several times greater than $I_Q$. However, when the current in the first driver $D_1$ decreases to a level less than $I_Q/2$, which is equal to $kI_R/2$, than the comparator output 176' transitions low. This causes the gate output 303 to transition high, which, in turn, triggers the flip-flop 302 causing the control signal CTL to transition high. As such, the second driver $D_2$ performs as a driver and the first driver $D_1$ performs as a constant current source. This causes the comparator output 178' and subsequently the EXOR gate output 303 to transition low and the cycle repeats. It is also clear that when the current to be sourced into or sinked from the load resistance 122 is less than $kI_R/2$, the control signal CTL may be in any one state, thereby, selecting any one of $D_1$, $D_2$ as the driver and the other as a constant current source.

Figure 4:
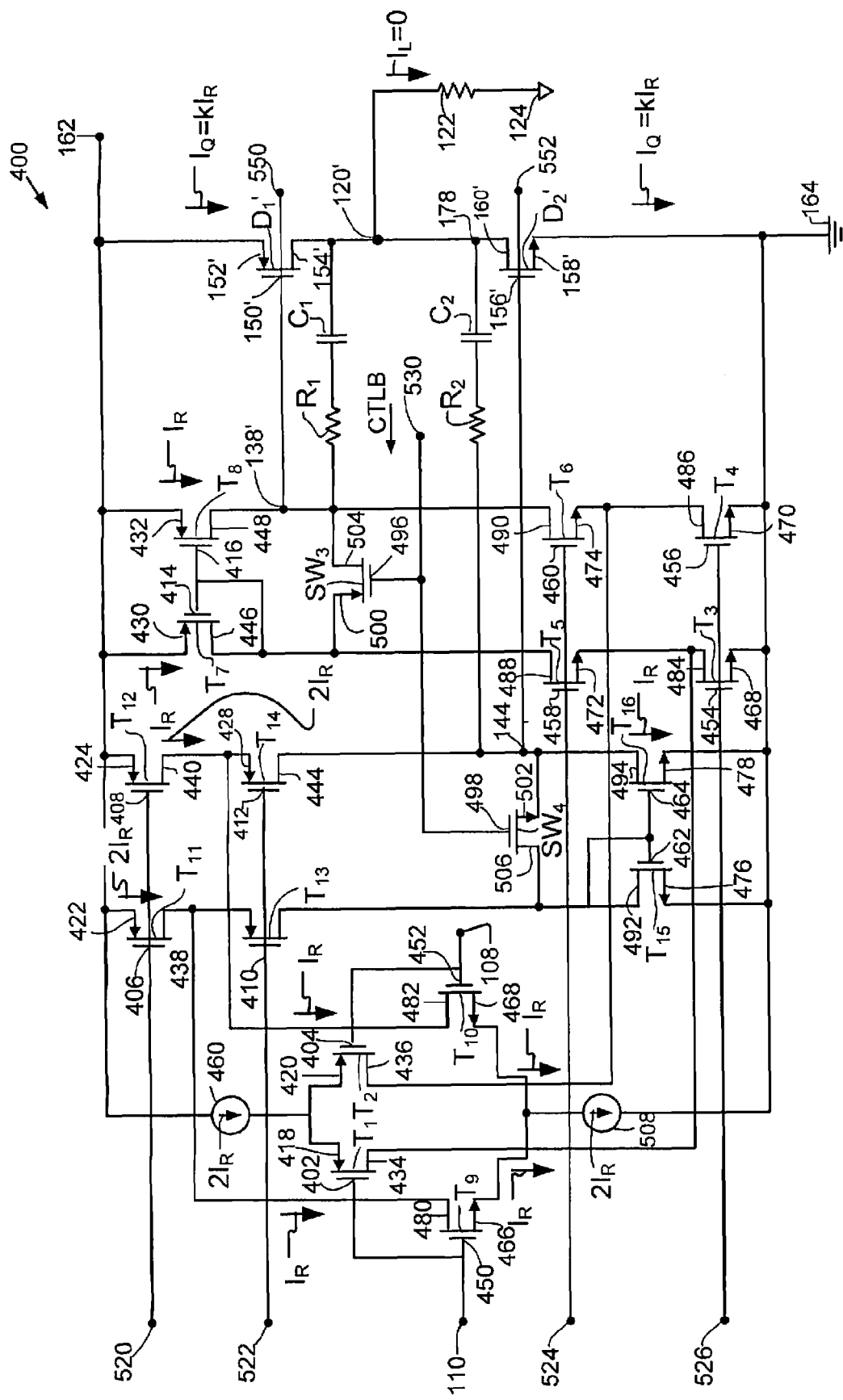
FIG. 4 is a schematic diagram of an amplifier according to another embodiment of the present disclosure.

Referring to FIGS. 2-4; a schematic diagram of an amplifier 400 is shown in FIG. 4. The amplifier 400 is a sample implementation that may be used for the amplifier 103. The currents shown in FIG. 4 are provided for the illustrated example and are under no signal condition, in other words, the amplifier 103 is not sinking or sourcing current into the load resistance 122. The first converter 130, 130' may be implemented via transistors $T_1$-$T_8$ and the second converter 132, 132' may be implemented via transistors $T_9$-$T_{16}$. Although transistors $T_1$-$T_{16}$ are shown, other similar or equivalent circuit devices and/or configurations may be used in replacement thereof. The switches $SW_1$, $SW_2$ may be implemented via transistors, designated $SW_3$, $SW_4$.

The transistors $T_1$-$T_8$ may have respective gates 402-416, sources 418-432, and drains 434-448, as shown. The transistors $T_9$-$T_{16}$ may have respective gates 450-464, sources 466-478, and drains 480-494, as shown. The switches $SW_3$, $SW_4$ may have gates 496, 498, sources 500, 502, drains 504, 506.

The transistors $T_1$ and $T_2$ are in a differential configuration. The gates 402, 404 are connected to the input terminals 110, 108. The sources 418, 420 are coupled to a current source 460, which in turn is coupled to the voltage supply terminal 162. The current source 460 has a supply current of $2I_R$. The drain 434 is connected to the source 472 and the drain 484. The drain 436 is connected to the source 474 and the drain 486. For the transistors $T_9$ and $T_{10}$, The gates 450, 452 are also coupled to the input terminals 110, 108. The sources 466, 468 are connected to a current supply 508, which in turn is connected to the ground 164. The drain 480 is connected to the drain 438. The drain 482 is connected to the drain 440.

The sources and drains of the transistors $T_3$, $T_5$, $T_7$ are connected in series between the voltage supply terminal 162 and the ground 164, as such when active the channels of $T_3$, $T_5$, $T_7$ are in series. The same holds for the transistors $T_4$, $T_6$, $T_8$, as well as, the transistors $T_{11}$, $T_{13}$, $T_{15}$. The same further holds for the transistors $T_{12}$, $T_{14}$, and $T_{16}$. As such, the sources 422, 424, 430, 432 are connected to the voltage supply terminal 162. The sources 476, 478, 468, and 470 are connected to the ground 164. The source 426 is connected to the drain 438. The drain 492 is connected to the drain 442. The source 428 is connected to the drain 440. The drain 494 is connected to the drain 444. The drain 488 is connected to the drain 446. The drain 484 is connected to the source 472. The drain 490 is connected to the drain 448. The drain 486 is connected to the source 474.

The gates of the transistors $T_3$-$T_6$ and $T_9$-$T_{14}$ are coupled to bias terminals 524, 526, 520, 522, respectively. The gates 406, 408 are connected to the bias terminal 520. The gates 410, 412 are connected to the bias terminal 522. The gates 458, 460 are connected to the bias terminal 524. The gates 454, 456 are connected to the bias terminal 526.

The switches $SW_3$, $SW_4$ are controlled via the control terminal 530 that receives the control signal CTLB and thus the gates 496, 498 are connected to the terminal 530. In the embodiment shown, since the switch $SW_3$ is a p-type transistor and the switch $SW_4$ is an n-type transistor, the same control signal is used to operate the switches $SW_3$, $SW_4$. The switch $SW_3$ and the transistors $T_5$, $T_6$ are in a current averaging configuration such that the current passing through the transistors $T_5$ and $T_6$ is averaged when $SW_3$ is closed or deactivated. The drain 488 is connected to the source 500. The drain 490 is connected to the drain 504. The average of the currents through the transistors $T_5$, $T_6$ is equal to the bias current received on the gate 150'. Likewise, the switch $SW_4$ and the transistors $T_{13}$, $T_{14}$ are in a current averaging configuration such that current passing through the transistors $T_{13}$ and $T_{14}$ is averaged when $SW_4$ is closed or deactivated. The drain 492 is connected to the drain 506. The drain 494 is connected to the source 502. The average of the currents through the transistors $T_{13}$, $T_{14}$ is equal to the bias current received on the gate 156'.

The transistors $T_{15}$, $T_{16}$ are respective loads to the transistors $T_{13}$, $T_{14}$. The gates 462, 464 are connected to the drain 492. Similarly, the transistors $T_7$, $T_8$ are loads to the transistors $T_5$, $T_6$. The gates 414, 416 are connected to the drain 446.

Similar to the drivers $D_1$, $D_2$, the drivers $D_1'$, $D_2'$ have associated gate 150', 156', sources 152', 158', and drains 154', 160'. The gate 150' is connected to the first converter output 138', which is taken from the connected drains 448, 490. The gate 156' is connected to the second converter output 144', which is taken from the connected source 502 and drains 444, 494. The source 152' is connected to the voltage supply terminal 162, the drains 154', 160' are connected to the amplifier output 120', which is connected to the load resistance 122. The source 158' is connected to ground 164.

A resistor $R_1$ and a capacitor $C_1$ are connected in series and between the drain 504 and the amplifier output 120'. A resistor $R_2$ and a capacitor $C_2$ are connected in series and between the source 502 and the amplifier output 120'. Resistors $R_1$, $R_2$, and capacitors $C_1$, $C_2$ are used as frequency compensation components.

The amplifier 400 further includes a first current sensing or driver input terminal 550 that is connected to the gate 150' and a second driver input terminal 552 that is connected to the gate 156'. The terminals 550, 552 are provided for sensing or sampling of the currents passing through the channels of the drivers $D_1'$, $D_2'$.

The aspect ratios of $T_7$, $T_8$ and the first driver $D_1'$ are related by equation (1).

$$(W/L)_{D1'} = k(W/L)_{T7} = k(W/L)_{T8} \qquad (1)$$

Similarly, the aspect ratios of $T_{15}$, $T_{16}$ and the second driver $D_2'$ are related by equation (2).

$$(W/L)_{D2'} = k(W/L)_{T15} = k(W/L)_{T16} \qquad (2)$$

When the control signal CTLB is low, the switch $SW_4$ is OFF and the switch $SW_3$ is ON. Considering that an input signal is applied, the currents in $T_5$ and $T_6$ are given by $I_R + \delta I_R$ and $I_R - \delta I_R$ respectively, $\delta I_R$ is the signal current magnitude generated by the input signals voltages at In+, In−. Since the switch $SW_3$ is ON, the input signal components cancel by addition and the transistors $T_7$, $T_8$ carry a constant bias current of $I_R$ each. Since the transistors $T_7$, $T_8$ are configured as mirrors with the first driver $D_1'$, the driver $D_1'$ carries a constant current of $kI_R$ according to equation (1).

On the other hand, such signal current cancellation does not occur for the transistors $T_{15}$, $T_{16}$, since the second switch $SW_2$ is OFF, and the signal variations will be passed normally onto the second driver $D_2'$, which sinks the signal current from the load resistance 122. In the same manner, when the control signal CTL is low and signal is applied, the second driver $D_2'$ carries a constant current of $kI_R$ according to equation (2), whereas the first driver $D_1'$ sources signal current into the load resistance 122.

Figure 5:
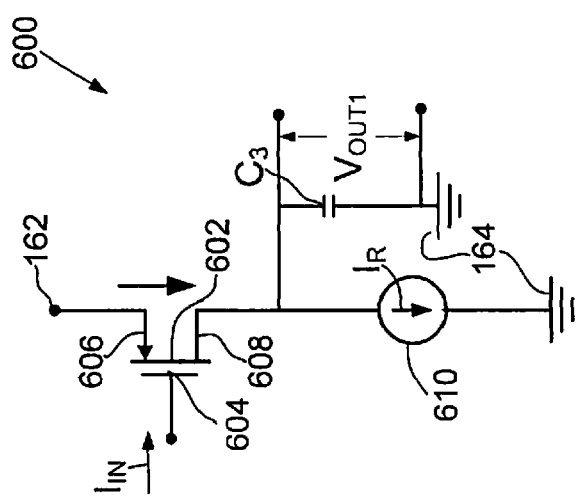
FIG. 5 is a schematic diagram of a PMOS current comparator according to an embodiment of the present disclosure.

Referring to FIGS. 2, 3 and 5, a schematic diagram of a PMOS current comparator 600 that may be used for the comparators 180, 240 is shown. The current comparator 600 includes a PMOSFET 602 that has a gate 604, a source 606 and drain 608. The gate 602 receives the input voltage $v_{IN}$. The source 606 is connected to the voltage supply terminal 162. The drain 608 is connected to a current source 610, which is in turn connected to ground 164, and to the input S of the SR flip-flop 220. The current source 610 has the bias current $I_R$. A capacitor $C_3$ is connected in parallel with the current source 610. When current through the p-channel of the PMOSFET 602 is greater than $I_R$ than the output voltage $V_{OUT1}$ across the capacitor $C_3$ is high and is low otherwise.

The PMOSFET 600 ($T_{600}$) helps scale down the current in the first driver $D_1$ by a factor of 2/k. This is done by connecting the gate 604 to the gate 150 of the driver $D_1$. The scaling down of the current is implemented by relating the aspect ratios of the PMOSFET 600 and the first driver $D_1$ as shown in equation (4).

$$(W/L)_{T600} = (2/k)*(W/L)_{D1} \quad (4)$$

The capacitor $C_3$ helps to maintain sufficient pulse width for setting of the flip-flop 220 by slowing down changes in the output voltage $V_{OUT2}$ or the input S, thus preventing a race condition.

Figure 6:
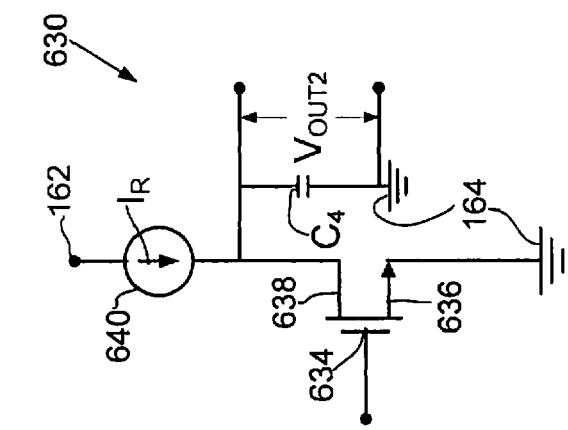
FIG. 6 is a schematic diagram of an NMOS current comparator according to an embodiment of the present disclosure.

Referring to FIGS. 2, 3 and 6, a schematic diagram of an NMOS current comparator 630 that may be used for the comparators 200, 270 is shown. The current comparator 630 includes an NMOSFET 632 ($T_{632}$) that has a gate 634, a source 636, and a drain 638. The gate 634 receives the input voltage $v_{IN}$. The source 636 is connected to ground 164. The drain 638 is connected to a current source 640 that has the bias current $I_R$. The drain 638 is also connected to a capacitor $C_4$, which is connected to ground 164, and to the input R of the SR flip-flop 220. When current through the n-channel of the NMOSFET 632 is greater than $I_R$ than the output voltage $V_{OUT2}$ across the capacitor $C_4$ is low and is high otherwise.

The NMOSFET 632 helps scale down the current in the second driver $D_2$ by a factor 2/k. This is done by connecting the gates 634 to the gate 156 of the second driver $D_2$. The scaling down of current is implemented by relating the aspect ratios of the NMOSFET 632 and the second driver $D_2$ as in equation (5):

$$(W/L)_{T632} = (2/k)*(W/L)_{D2} \quad (5)$$

The capacitor $C_4$ helps to maintain sufficient pulse width for resetting of the flip flop 220 by slowing down changes in the output voltage $V_{out2}$, thus preventing a race condition.

Figure 7:
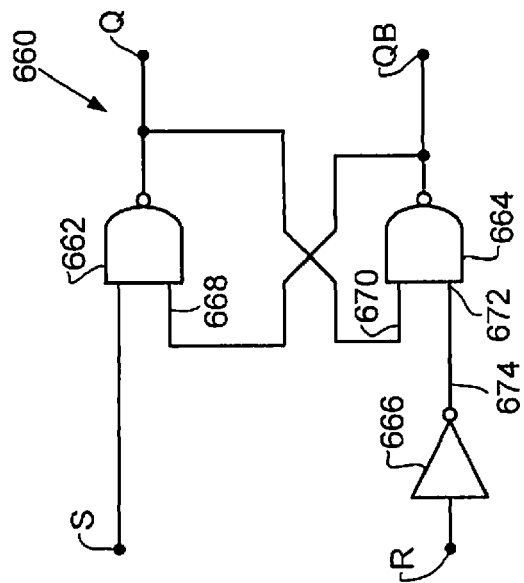
FIG. 7 is a logic schematic diagram of a SR-flip flop according to an embodiment of the present disclosure.

Referring to FIGS. 2 and 7, a logic schematic diagram of a SR-flip flop 660 is shown. The flip flop 660 has the inputs S, R and the outputs Q, QB and includes a first nand gate 662, a second nand gate 664 and an inverter 666. The first nand gate 662 has the input S, the input 668, which is connected to the output QB and the output Q. The second nand gate 664 has the inputs 670, 672 and the output QB. The input 670 is connected to the output Q and the input 672 is connected to the inverted output 674 of the inverter 666. The inverter 666 inverts the reset input R.

Figure 8:
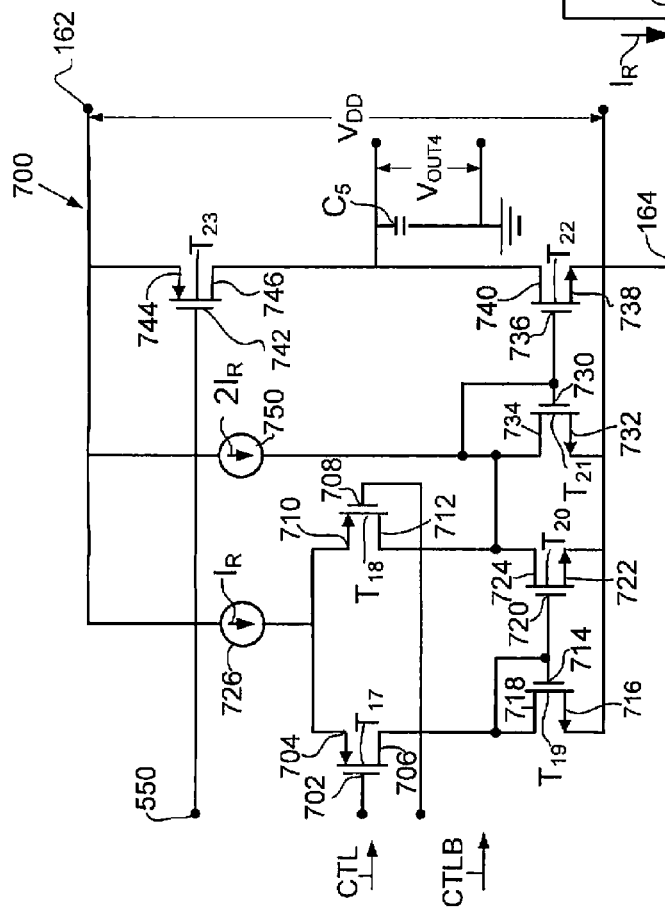
FIG. 8 is a schematic diagram of an PMOS current comparator according to another embodiment of the present disclosure.

Referring to FIGS. 3 and 8, a schematic diagram of another PMOS current comparator 700 is shown. The current comparator 700 includes transistors $T_{17}$-$T_{23}$. The transistors $T_{17}$, $T_{18}$ are in a differential configuration and have the load transistors $T_{19}$, $T_{20}$. The transistor $T_{17}$ has a gate 702, a source 704 and a drain 706. The transistor $T_{18}$ has a gate 708, a source 710 and a drain 712. The transistor $T_{19}$ has a gate 714, a source 716 and a drain 718. The transistor $T_{20}$ has a gate 720, a source 722 and a drain 724. The gates 702, 708 receive the control signals CTL, CTL, respectively. The gates 714, 720 are connected to the drains 706, 718. The sources 704, 710 are connected to a current supply 726, which has bias current $I_R$ and is connected to the voltage supply terminal 162. The sources 716, 722 are connected to ground 164. The drain 724 is connected to the drain 712.

The transistor $T_{21}$ has a gate 730, a source 732 and a drain 734. The transistor $T_{22}$ has a gate 736, a source 738 and a drain 740. The transistor $T_{23}$ has a gate 742, a source 744 and a drain 746. The gates 730, 736 are connected to the drains 724, 734. The sources 732, 738 are connected to ground 164. The drain 734 is connected to a current supply 750, which has the bias current $2I_R$ and is connected to the voltage supply terminal 162. The drains 740, 746 are connected to each other and to a capacitor $C_5$, which is in turn connected to ground 164. The gate 742 is connected to the driver input terminal 550. The source 744 is also connected to the voltage supply terminal 162. The output voltage $V_{OUT3}$ is measured across capacitor $C_5$.

When the control signal CTL is high, the bias current $I_R$ through the transistor $T_{18}$ adds with the bias current $2I_R$ at the transistor $T_{21}$ and, therefore, a current of $2I_R+I_R=3I_R$ is mirrored through the transistor $T_{22}$ to be compared against the current in the transistor $T_{23}$. This is equivalent to selecting a reference current equal to $I_R$. The output 176' is high if the current in the transistor $T_{23}$ exceeds that in the transistor $T_{22}$ and is low otherwise.

When the control signal CTL is low, the bias current $I_R$ through the transistors $T_{17}$, $T_{18}$, $T_{19}$ subtracts from bias current $2I_R$ at the transistor $T_{21}$, and, therefore, a current of $I_R$ is mirrored through the transistor $T_{22}$ to be compared against the current in the transistor $T_{23}$. This is equivalent to selecting a reference current equal to $I_R$. The capacitor $C_5$ helps to maintain sufficient width for the narrow pulse at the gate output 303 by slowing down changes in the output voltage $V_{OUT3}$ or 176' thus preventing a race condition while triggering the flip-flop.

Figure 9:
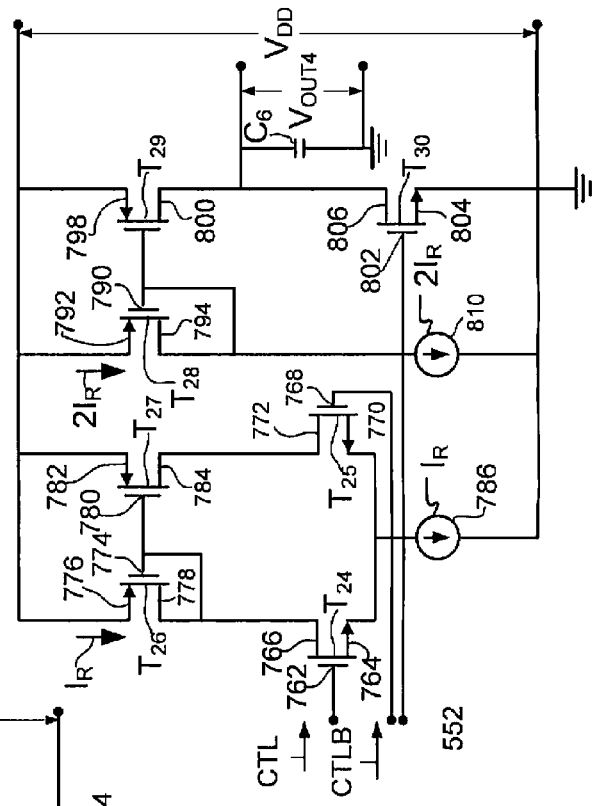
FIG. 9 is a schematic diagram of a NMOS current comparator according to another embodiment of the present disclosure.

Referring to FIG. 9, a schematic diagram of another NMOS current comparator 760 is shown. The current comparator 760 includes transistors $T_{24}$-$T_{30}$. The transistors $T_{24}$, $T_{25}$ are in a differential configuration and have the load transistors $T_{26}$, $T_{27}$. The transistor $T_{24}$ has a gate 762, a source 764 and a drain 766. The transistor $T_{25}$ has a gate 768, a source 770 and a drain 772. The transistor $T_{26}$ has a gate 774, a source 776 and a drain 778. The transistor $T_{27}$ has a gate 780, a source 782 and a drain 784. The gates 762, 768 receive the control signals CTL, CTL, respectively. The sources 764, 770 are connected to a current source 786 that has the reference current $I_R$ and is in turn connected to ground 164. The drains 766, 772 are connected to the drains 778, 784, respectively. The drain 778 is connected to the gates 774, 780. The sources 776, 782 are connected to the voltage supply terminal 162.

The transistor $T_{28}$ has a gate 790, a source 792 and a drain 794. The transistor $T_{29}$ has a gate 796, a source 798 and a drain 800. The transistor $T_{30}$ has a gate 802, a source 804 and a drain 806. The gates 790, 796 are connected to the drain 794 and to a current source 810 that has the reference current $2I_R$ and is in turn connected to ground 164. The sources 792, 798 are connected to the voltage supply terminal 162. The drains 800, 806 are connected to each other and to a capacitor $C_6$, which is in turn connected to ground 164. The gate 802 is connected to the current sensing or driver input terminal 552. The source 804 is also connected to ground 164.

When the control signal CTL is high, the bias current $I_R$ through the transistors $T_{24}$, $T_{26}$, $T_{27}$ subtracts from the bias current $2I_R$ at the transistor $T_{28}$ and, therefore, a current of $I_R$ is mirrored through the transistor $T_{29}$, which is compared against the current in the transistor $T_{30}$. This is equivalent to selecting a reference current equal to $I_R$.

When the control signal CTL is low, the bias current $I_R$ through the transistor $T_{25}$ adds with bias current $2I_R$ at the transistor $T_{28}$, and, therefore, a current of $2I_R+I_R=3I_R$ is mirrored through the transistor $T_{29}$ to be compared against the current in the transistor $T_{30}$. This is equivalent to selecting a reference current equal to $3I_R$. The capacitor $C_6$ helps to maintain sufficient width for the narrow pulse at the gate output 303 by slowing down changes in the output voltage $V_{OUT4}$ or 270 thus preventing a race condition while triggering the flip-flop. The output voltage $V_{OUT4}$ is measured across the capacitor $C_6$.

Referring to FIGS. 2, 3, 10-15, simulation results are provided for a sample implementation using the amplifier circuits of FIGS. 2 and 3. are shown. In the sample implementation the voltage supply potential is 5V. The amplifier 103 is configured as a unity gain inverting amplifier. The input signal is a 2Vpeak, 1 KHz signal. The load resistance is 1KΩ.

Figure 10:
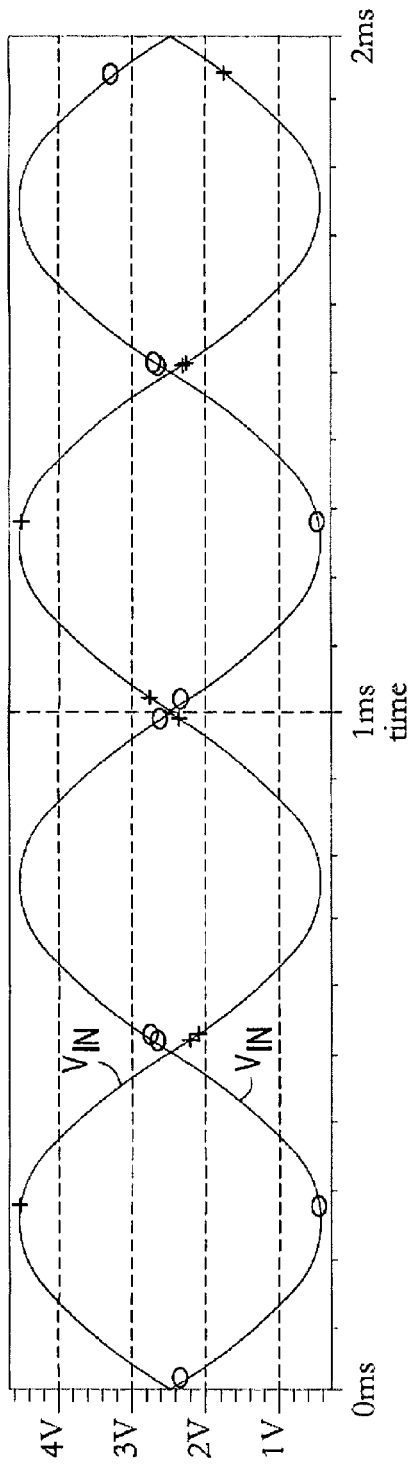
FIG. 10 is a plot illustrating input and output of an amplifier designed according to the amplifiers of FIGS. 2 and 3, used in an example implementation and according to another embodiment of the present disclosure.
Figure 11:
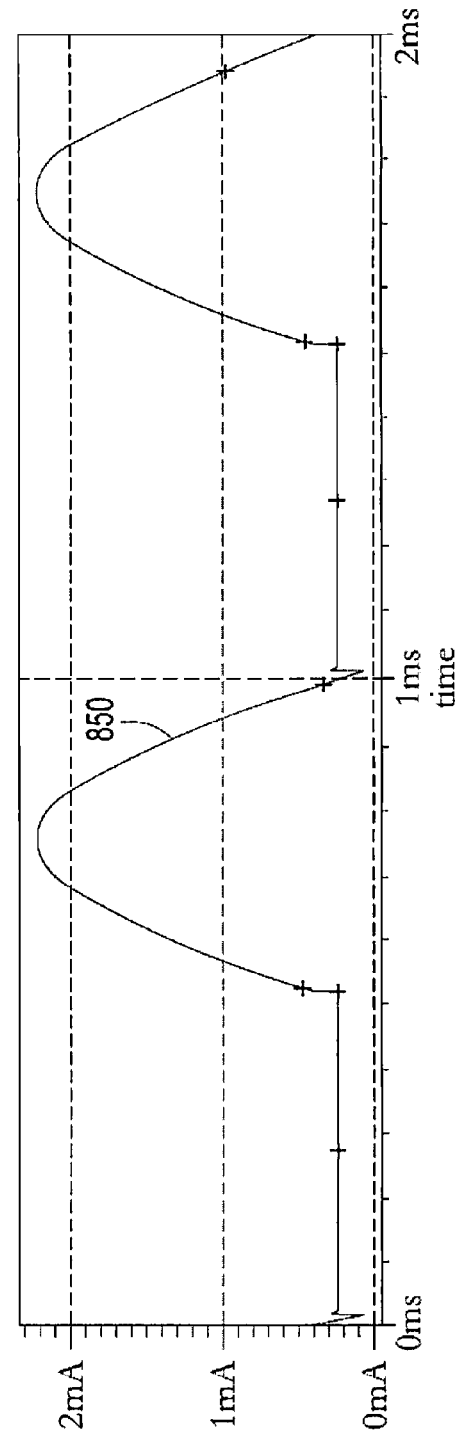
FIG. 11 is a plot illustrating current source driver magnitudes of a sourcing current source driver of the amplifier circuits of FIGS. 2 and 3 according to the embodiment of FIG. 10.
Figure 12:
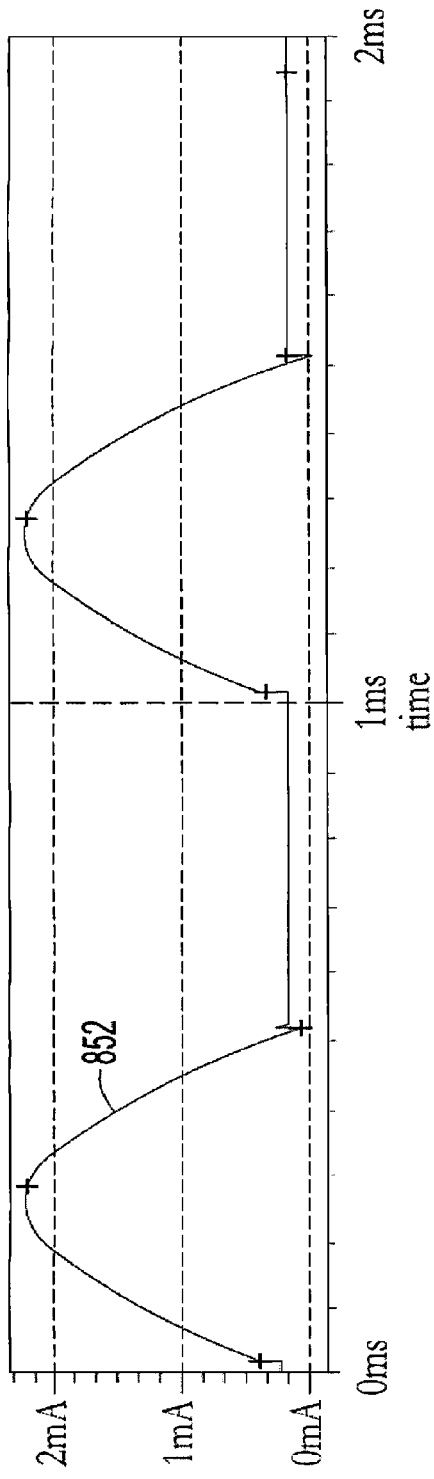
FIG. 12 is a plot illustrating current source driver magnitudes of a sinking current source driver of the amplifier circuits of FIGS. 2 and 3 according to the embodiment of FIG. 10.
Figure 13:
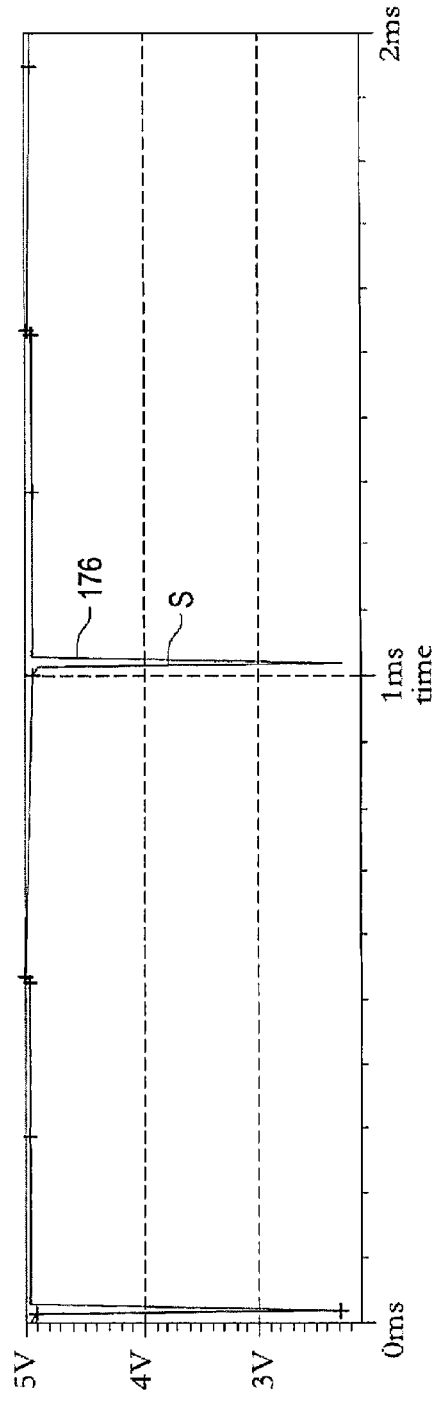
FIG. 13 is a plot illustrating a first comparator circuit output/set input of the amplifier circuit of FIG. 2 and according to the embodiment of FIG. 10.
Figure 14:
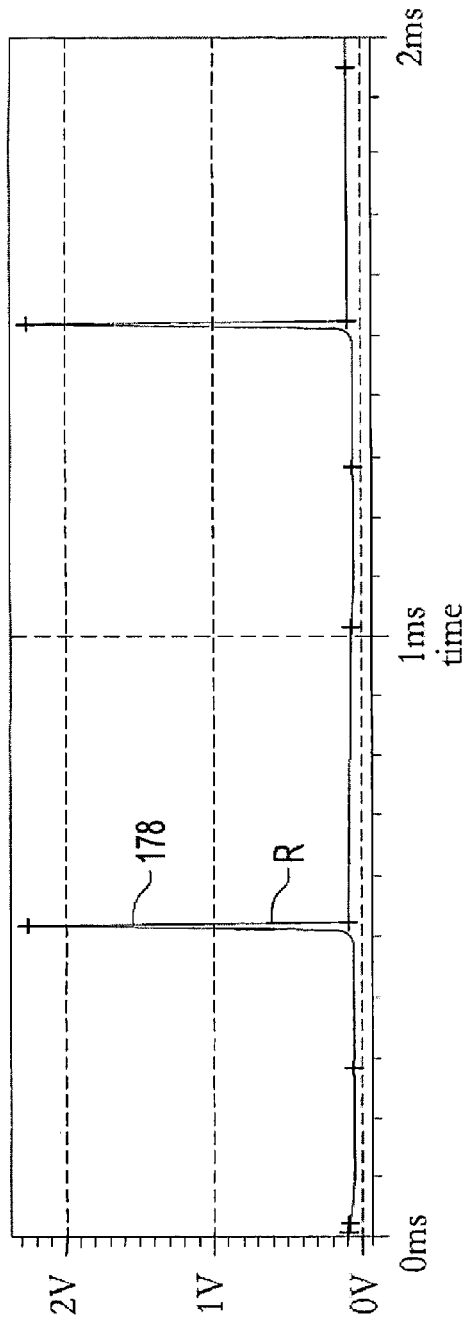
FIG. 14 is a plot illustrating a second comparator circuit output/reset input of the amplifier circuit of FIG. 2 and according to the embodiment of FIG. 10.
Figure 15:
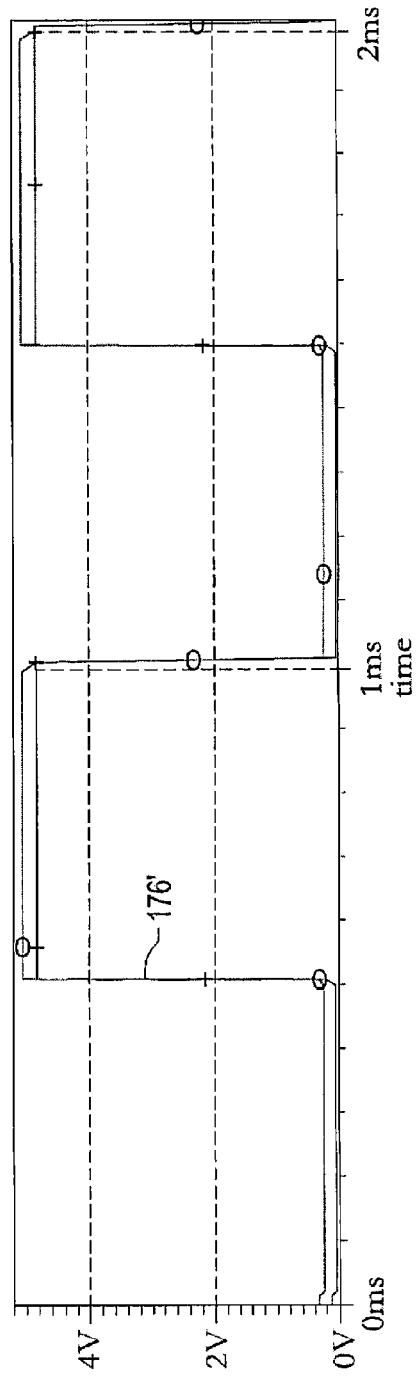
FIG. 15 is a plot illustrating a first comparator circuit output of the amplifier circuit of FIG. 3 and according to the embodiment of FIG. 10.
Figure 16:
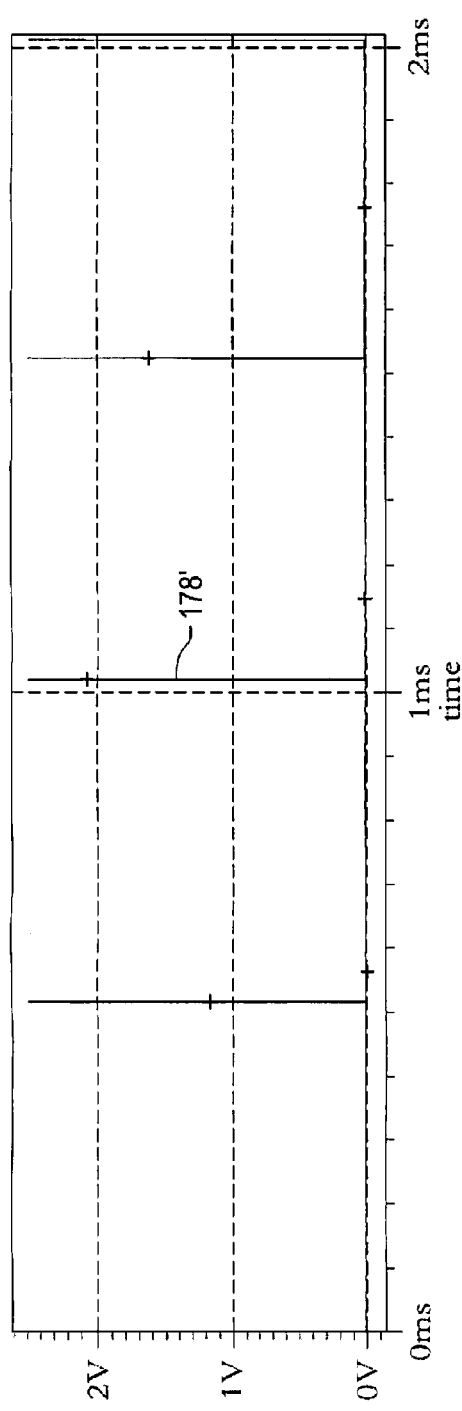
FIG. 16 is a plot illustrating a first comparator circuit output of the amplifier circuit of FIG. 3 and according to the embodiment of FIG. 10.
Figure 17:
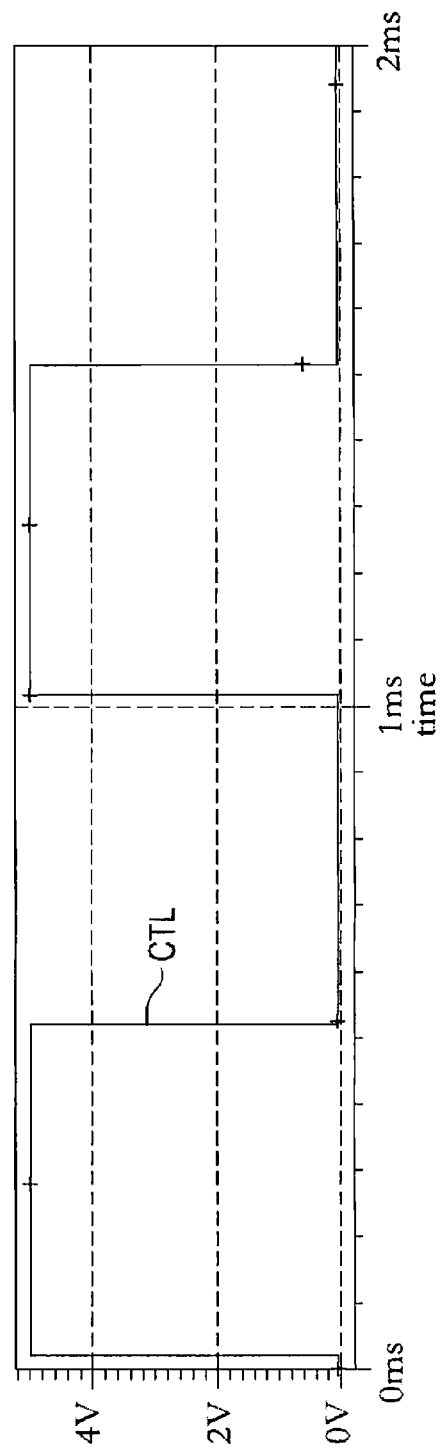
FIG. 17 is a plot illustrating a control signal according to the embodiments of FIGS. 2, 3, and 10.

FIG. 10 is a plot illustrating input voltage $V_{in}$ (not shown in FIGS. 2, 3) and output voltage $V_{OUT}$ of the amplifier 103 over time. FIG. 11 is a plot illustrating current source driver magnitudes 850 of the first drivers $D_1$, $D_1'$ over time. A single plot is shown since the magnitudes are the same for the example implementation. FIG. 12 is a plot illustrating current source driver magnitudes 852 of the second drivers $D_2$, $D_2'$ over time. A single plot is shown since the magnitudes are the same for the example implementation. FIG. 13 is a plot illustrating a first comparator circuit output 176/set input S of the amplifier circuit 100 over time. FIG. 14 is a plot illustrating a second comparator circuit output 178/reset input R of the amplifier circuit 100 over time. FIG. 15 is a plot illustrating a first comparator circuit output 176' of the amplifier circuit 100' over time. FIG. 16 is a plot illustrating a first comparator circuit output 178' of the amplifier circuit 100' over time. FIG. 17 is a plot illustrating the control signal CTL over time.

Referring to FIGS. 18A-18G, various exemplary implementations incorporating the teachings of the present disclosure are shown.

Figure 18A:
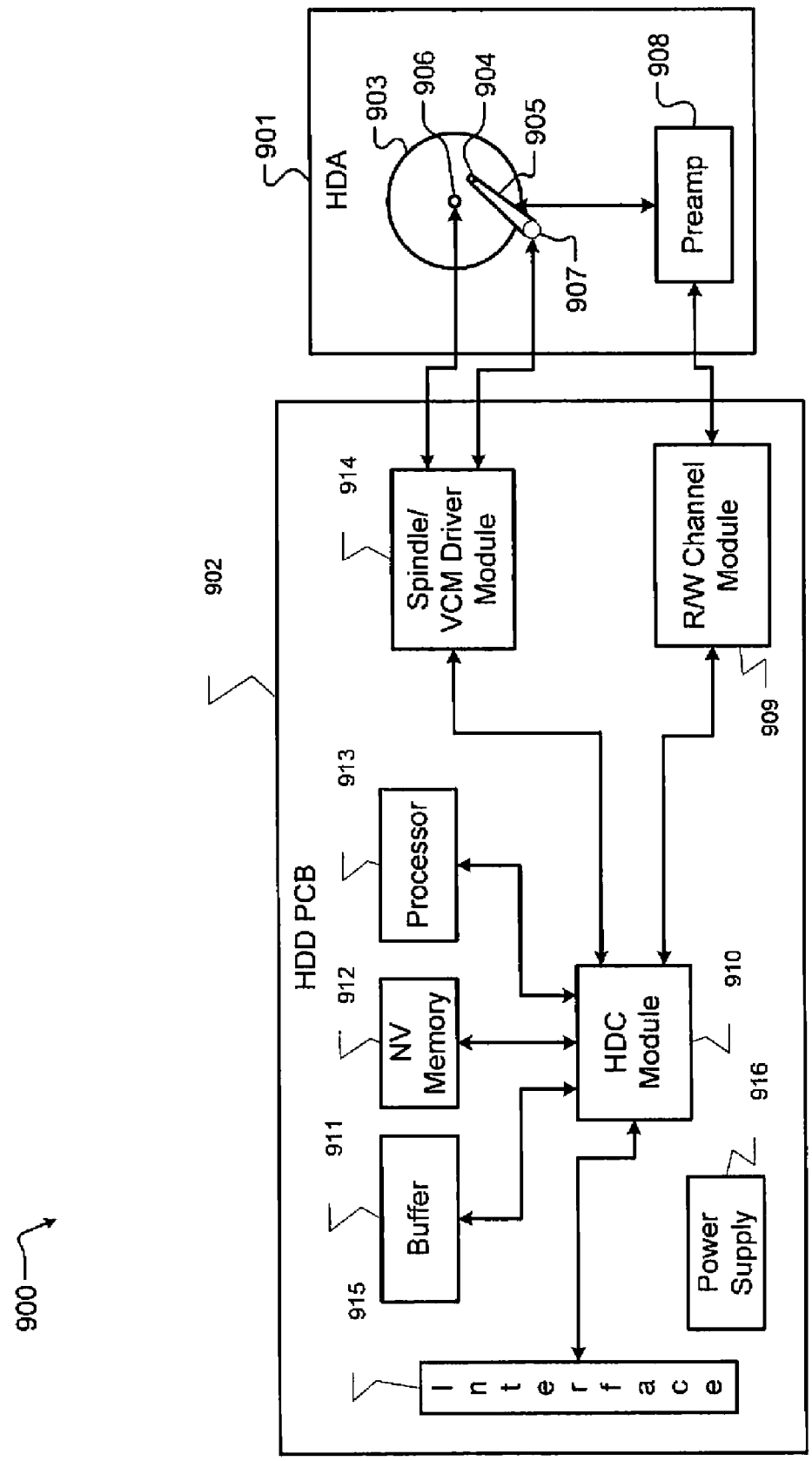
FIG. 18A is a functional block diagram of a hard disk drive (HDD) system according to an embodiment of the present disclosure.

Referring now to FIG. 18A, the teachings of the disclosure can be implemented in a hard disk drive (HDD) 900, such as in a hard disk assembly 901 and in a HDD PCB 902 thereof, as further described below. The HDA 901 may also include a magnetic medium 903, such as one or more platters that store data, and a read/write device 904. The read/write device 904 may be arranged on an actuator arm 905 and may read and write data on the magnetic medium 903. Additionally, the HDA 901 includes a spindle motor 906 that rotates the magnetic medium 903 and a voice-coil motor (VCM) 907 that actuates the actuator arm 905. The above-described amplifiers and amplifier circuits may be utilized within and to drive the VCM 907. A preamplifier device 908 amplifies signals generated by the read/write device 904 during read operations and provides signals to the read/write device 904 during write operations.

The HDD PCB 902 includes a read/write channel module (hereinafter, "read channel") 909, a hard disk controller (HDC) module 910, a buffer 911, nonvolatile memory 912, a processor 913, and a spindle/VCM driver module 914. The above-described amplifiers and amplifier circuits may be utilized within the spindle/VCM driver module 914 to drive the VCM 907. The read channel 909 processes data received from and transmitted to the preamplifier device 908. The HDC module 910 controls components of the HDA 901 and communicates with an external device (not shown) via an I/O interface 915. The external device may include a computer, a multimedia device, a mobile computing device, etc. The I/O interface 915 may include wireline and/or wireless communication links. The HDD PCB 902 includes a power supply 916 that provides power to the components of the HDD 900.

The HDC module 910 may receive data from the HDA 901, the read channel 909, the buffer 911, nonvolatile memory 912, the processor 913, the spindle/VCM driver module 914, and/or the I/O interface 915. The processor 913 may process the data, including encoding, decoding, filtering, and/or formatting. The processed data may be output to the HDA 901, the read channel 909, the buffer 911, nonvolatile memory 912, the processor 913, the spindle/VCM driver module 914, and/or the I/O interface 915.

The HDC module 910 may use the buffer 911 and/or nonvolatile memory 912 to store data related to the control and operation of the HDD 900. The buffer 911 may include DRAM, SDRAM, etc. The nonvolatile memory 912 may include flash memory (including NAND and NOR flash memory), phase change memory, magnetic RAM, or multistate memory, in which each memory cell has more than two states. The spindle/VCM driver module 914 controls the spindle motor 906 and the VCM 907. The teachings of the disclosure may be utilized to drive the VCM 907.

Figure 18B:
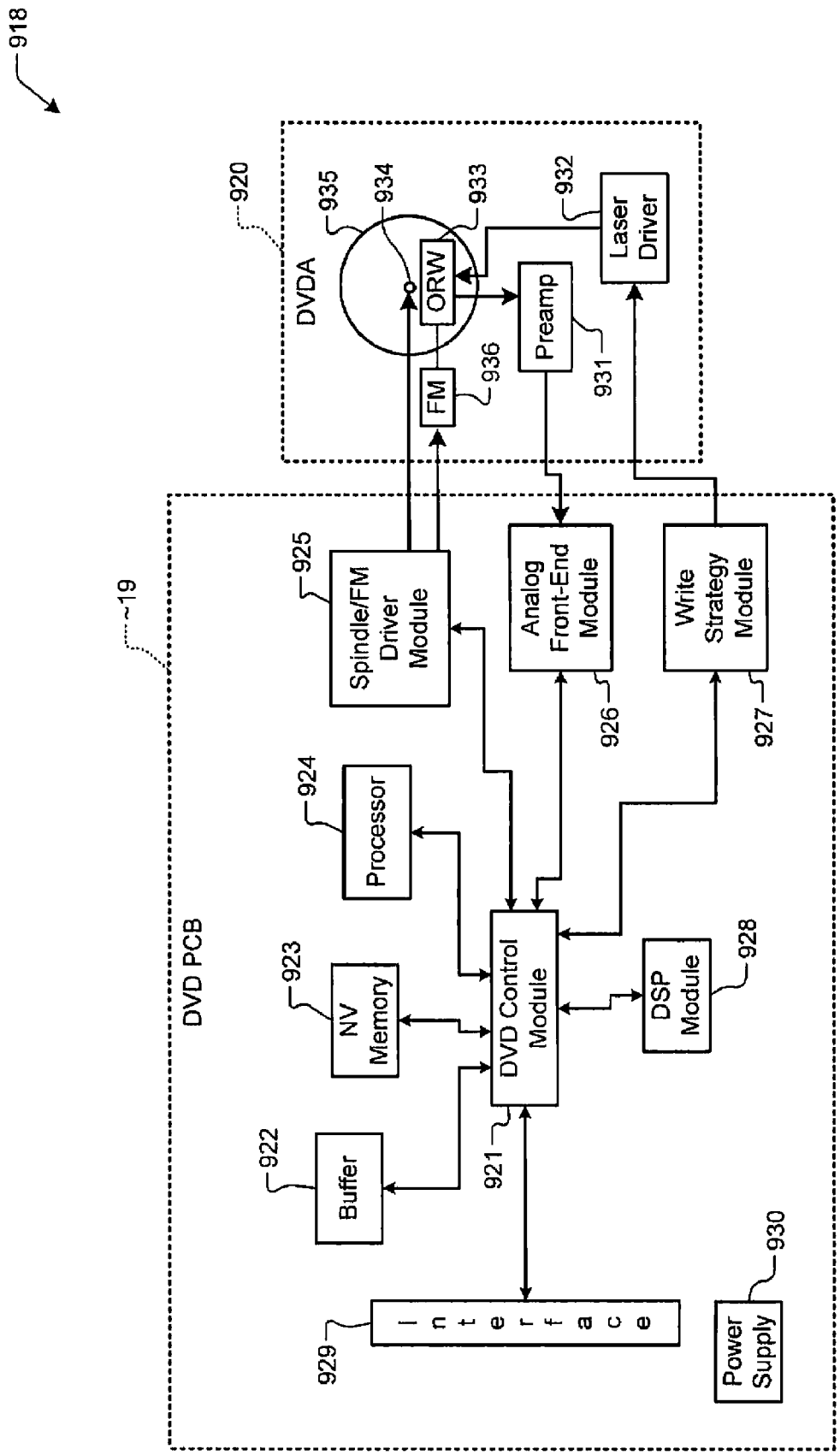
FIG. 18B is a functional block diagram of a digital versatile disk (DVD) according to an embodiment of the present disclosure.

Referring now to FIG. 18B, the teachings of the disclosure can be implemented in a DVD 918 or of a CD drive (not shown), such as in a DVD PCB 919 and a DVD assembly (DVDA) 920 thereof. The DVD PCB 919 includes a DVD control module 921, a buffer 922, nonvolatile memory 923, a processor 924, a spindle/FM (feed motor) driver module 925, an analog front-end module 926, a write strategy module 927, and a DSP module 928. The above-described amplifiers and amplifier circuits may be utilized within the driver module 925 to drive one or more motors attached thereto, such as that described below.

The DVD control module 921 controls components of the DVDA 920 and communicates with an external device (not shown) via an I/O interface 929. The external device may include a computer, a multimedia device, a mobile computing device, etc. The I/O interface 929 may include wireline and/or wireless communication links.

The DVD control module 921 may receive data from the buffer 922, nonvolatile memory 923, the processor 924, the spindle/FM driver module 925, the analog front-end module 926, the write strategy module 927, the DSP module 928, and/or the I/O interface 929. The processor 924 may process the data, including encoding, decoding, filtering, and/or formatting. The DSP module 928 performs signal processing, such as video and/or audio coding/decoding. The processed data may be output to the buffer 922, nonvolatile memory 923, the processor 924, the spindle/FM driver module 925, the analog front-end module 926, the write strategy module 927, the DSP module 928, and/or the I/O interface 929.

The DVD control module 921 may use the buffer 922 and/or nonvolatile memory 923 to store data related to the control and operation of the DVD drive 918. The buffer 922 may include DRAM, SDRAM, etc. The nonvolatile memory 923 may include flash memory (including NAND and NOR flash memory), phase change memory, magnetic RAM, or multi-state memory, in which each memory cell has more than two states. The DVD PCB 919 includes a power supply 930 that provides power to the components of the DVD drive 918.

The DVDA 920 may include a preamplifier device 931, a laser driver 932, and an optical device 933, which may be an optical read/write (ORW) device or an optical read-only (OR) device. A spindle motor 934 rotates an optical storage medium 935, and a feed motor 936 actuates the optical device 933 relative to the optical storage medium 935.

When reading data from the optical storage medium 935, the laser driver provides a read power to the optical device 933. The optical device 933 detects data from the optical storage medium 935, and transmits the data to the preamplifier device 931. The analog front-end module 926 receives data from the preamplifier device 931 and performs such functions as filtering and A/D conversion. To write to the optical storage medium 935, the write strategy module 927 transmits power level and timing information to the laser driver 932. The laser driver 932 controls the optical device 933 to write data to the optical storage medium 935.

Figure 18D:
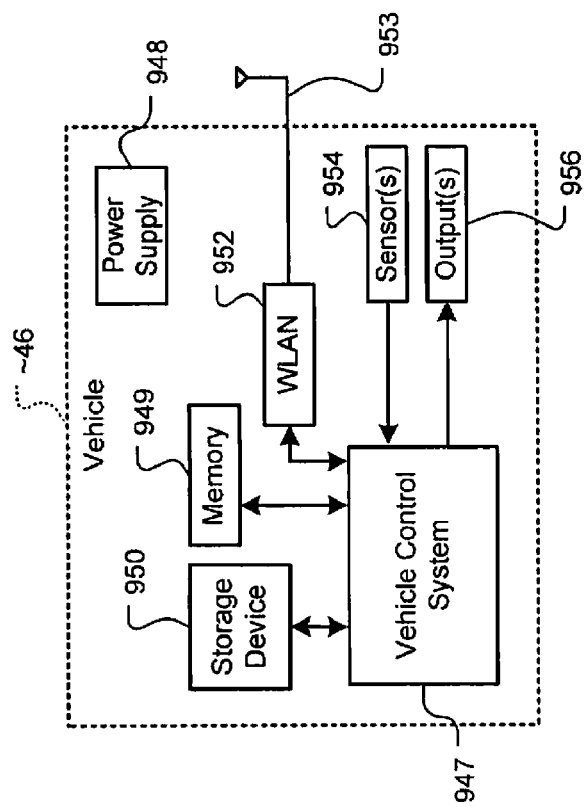
FIG. 18D is a functional block diagram of a vehicle control system according to an embodiment of the present disclosure.
Figure 18C:
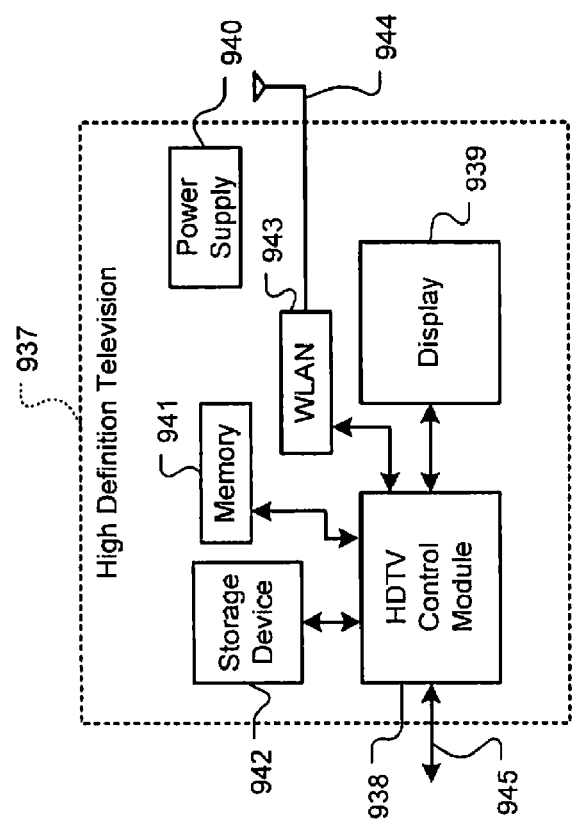
FIG. 18C is a functional block diagram of a high definition television according to an embodiment of the present disclosure.

Referring now to FIG. 18C, the teachings of the disclosure can be implemented in the high definition television (HDTV) 937 such as in the HDTV control module 938 and the power supply 939. The HDTV 937 also includes a display 940, a memory 941, a storage device 942, a WLAN interface 943 and an associated antenna 944, and an external interface 945. The above-described amplifiers and amplifier circuits may be utilized within the storage device 942 to drive any memory device motors contained therein.

The HDTV 937 can receive input signals from the WLAN interface 943 and/or the external interface 945, which sends and receives information via cable, broadband Internet, and/or satellite. The HDTV control module 938 may process the input signals, including encoding, decoding, filtering, and/or formatting, and generate output signals. The output signals may be communicated to one or more of the display 940, memory 941, the storage device 942, the WLAN interface 943, and the external interface 945.

Memory 941 may include random access memory (RAM) and/or nonvolatile memory such as flash memory, phase change memory, or multi-state memory, in which each memory cell has more than two states. The storage device 942 may include an optical storage drive, such as a DVD drive, and/or a hard disk drive (HDD). The HDTV control module 938 communicates externally via the WLAN interface 943 and/or the external interface 945. The power supply 939 provides power to the components of the HDTV 937.

Referring now to FIG. 18D, the teachings of the disclosure may be implemented in a vehicle 946, such as in a vehicle control system 947 and a power supply 948 thereof. The vehicle 946 may also include a memory 949, a storage device 950, and a WLAN interface 952 and associated antenna 953. The vehicle control system 947 may be a powertrain control system, a body control system, an entertainment control system, an anti-lock braking system (ABS), a navigation system, a telematics system, a lane departure system, an adaptive cruise control system, etc. The above-described amplifiers and amplifier circuits may be utilized within the storage device 950 to drive any memory device motors contained therein.

The vehicle control system 947 may communicate with one or more sensors 954 and generate one or more output signals 956. The sensors 954 may include temperature sensors, acceleration sensors, pressure sensors, rotational sensors, airflow sensors, etc. The output signals 956 may control engine operating parameters, transmission operating parameters, suspension parameters, etc.

The power supply 948 provides power to the components of the vehicle 946. The vehicle control system 947 may store data in memory 949 and/or the storage device 950. Memory 949 may include random access memory (RAM) and/or nonvolatile memory such as flash memory, phase change memory, or multi-state memory, in which each memory cell has more than two states. The storage device 950 may include an optical storage drive, such as a DVD drive, and/or a hard disk drive (HDD). The vehicle control system 947 may communicate externally using the WLAN interface 952.

Figure 18F:
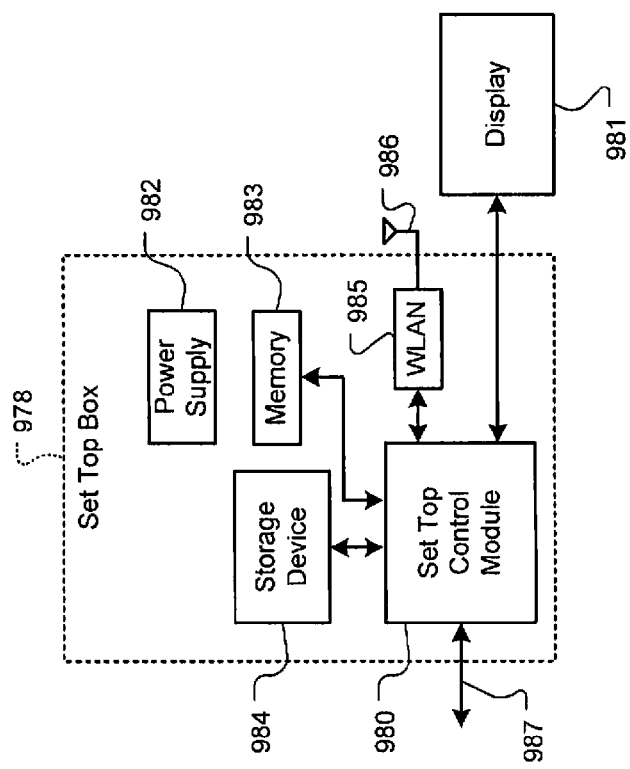
FIG. 18F is a functional block diagram of a set top box according to an embodiment of the present disclosure.
Figure 18E:
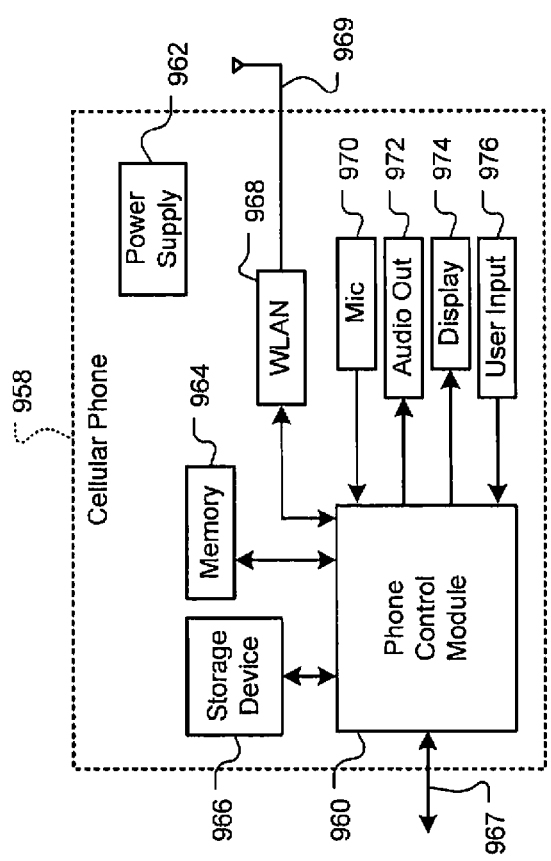
FIG. 18E is a functional block diagram of a cellular phone according to an embodiment of the present disclosure.

Referring now to FIG. 18E, the teachings of the disclosure can be implemented in a cellular phone 958, such as in a phone control module 960 and a power supply 962 thereof. The phone 958 also includes a memory 964, a storage device 966, and a cellular network interface 967. The cellular phone 958 may include a WLAN interface 968 and associated antenna 969, a microphone 970, an audio output 972 such as a speaker and/or output jack, a display 974, and a user input device 976 such as a keypad and/or pointing device. The above-described amplifiers and amplifier circuits may be utilized within the storage device 966 to drive any memory device motors contained therein.

The phone control module 960 may receive input signals from the cellular network interface 967, the WLAN interface 968, the microphone 970, and/or the user input device 976. The phone control module 960 may process signals, including encoding, decoding, filtering, and/or formatting, and generate output signals. The output signals may be communicated to one or more of memory 964, the storage device 966, the cellular network interface 967, the WLAN interface 968, and the audio output 972.

Memory 964 may include random access memory (RAM) and/or nonvolatile memory such as flash memory, phase change memory, or multi-state memory, in which each memory cell has more than two states. The storage device 966 may include an optical storage drive, such as a DVD drive, and/or a hard disk drive (HDD). The power supply 962 provides power to the components of the cellular phone 958.

Referring now to FIG. 18F, the teachings of the disclosure can be implemented in a set top box 978, such as in a set top control module 980 and a power supply 981 thereof. The set top box 978 also includes a display 982, a memory 983, a storage device 984, and a WLAN interface 985 and associated antenna 986. The above-described amplifiers and amplifier circuits may be utilized within the storage device 984 to drive any memory device motors contained therein.

The set top control module 980 may receive input signals from the WLAN interface 985 and an external interface 987, which can send and receive information via cable, broadband Internet, and/or satellite. The set top control module 980 may process signals, including encoding, decoding, filtering, and/or formatting, and generate output signals. The output signals may include audio and/or video signals in standard and/or high definition formats. The output signals may be communicated to the WLAN interface 985 and/or to the display 982. The display 981 may include a television, a projector, and/or a monitor.

The power supply 981 provides power to the components of the set top box 978. Memory 983 may include random access memory (RAM) and/or nonvolatile memory such as flash memory, phase change memory, or multi-state memory, in which each memory cell has more than two states. The storage device 984 may include an optical storage drive, such as a DVD drive, and/or a hard disk drive (HDD).

Figure 18G:
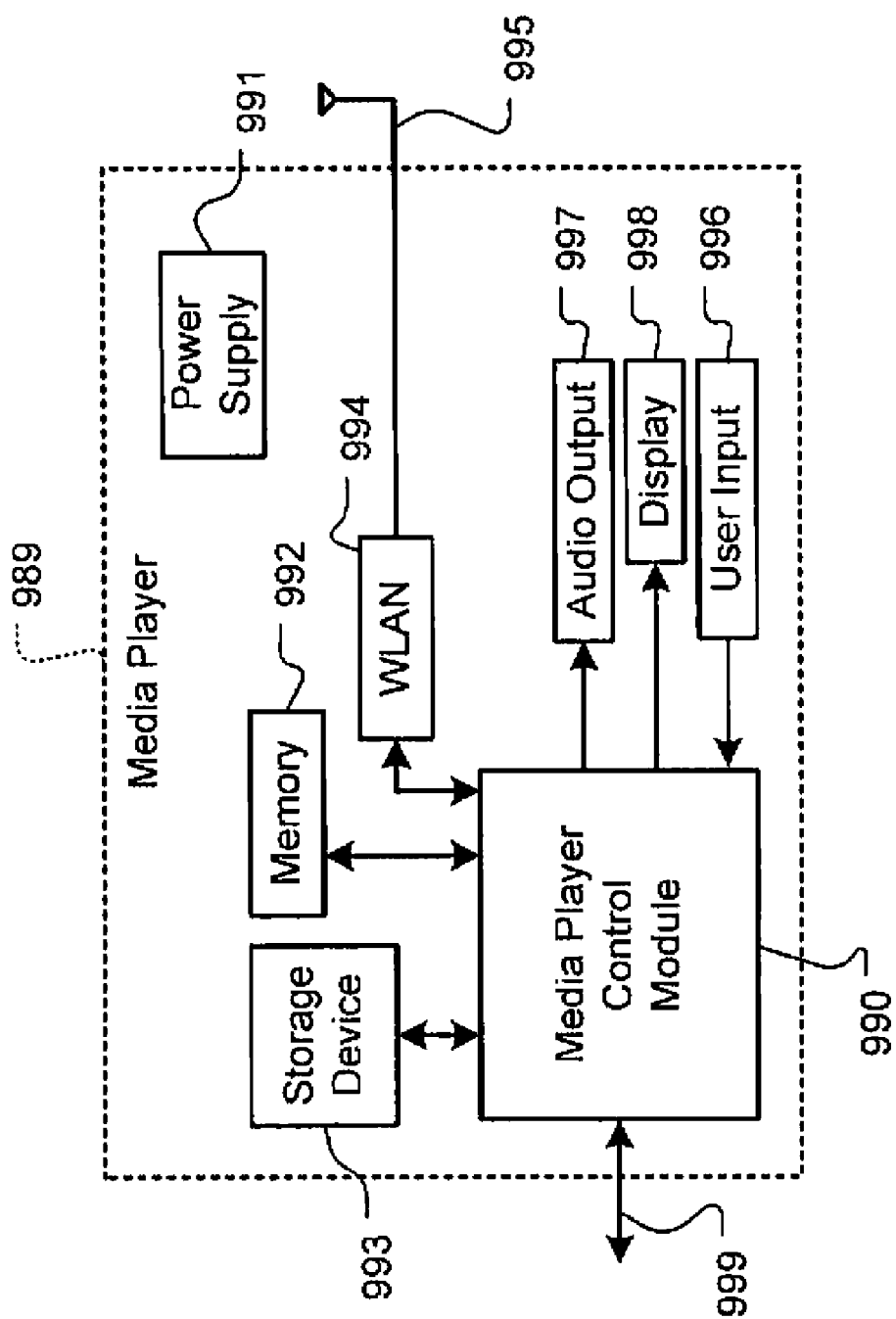
FIG. 18G is a functional block diagram of a media player according to an embodiment of the present disclosure.

Referring now to FIG. 18G, the teachings of the disclosure can be implemented in a media player 989, such as in a media player control module 990 and a power supply 991 thereof. The media player 989 may also include a memory 992, a storage device 993, a WLAN interface 994 and associated antenna 995, and an external interface 999. The above-described amplifiers and amplifier circuits may be utilized within the storage device 993 to drive any memory device motors contained therein.

The media player control module 990 may receive input signals from the WLAN interface 994 and/or the external interface 999. The external interface 999 may include USB, infrared, and/or Ethernet. The input signals may include compressed audio and/or video, and may be compliant with the MP3 format. Additionally, the media player control module 990 may receive input from a user input 996 such as a keypad, touchpad, or individual buttons. The media player control module 990 may process input signals, including encoding, decoding, filtering, and/or formatting, and generate output signals.

The media player control module 990 may output audio signals to an audio output 997 and video signals to a display 998. The audio output 997 may include a speaker and/or an output jack. The display 998 may present a graphical user interface, which may include menus, icons, etc. The power supply 991 provides power to the components of the media player 989. Memory 992 may include random access memory (RAM) and/or nonvolatile memory such as flash memory, phase change memory, or multi-state memory, in which each memory cell has more than two states. The storage device 993 may include an optical storage drive, such as a DVD drive, and/or a hard disk drive (HDD).

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. An amplifier circuit comprising:
   a first stage to generate a first stage output based on a signal input and a control input;
   a second stage in communication with the first stage output and the control input, the second stage including a first current source driver, wherein the first current source driver is operable in a constant current source mode or a driver mode, and wherein the first current source driver operates in either the constant current source mode or the driver mode based on the signal input and the control input; and
   a switch,
   wherein the first current source driver is blocked from receiving the signal input during the constant current source mode based on state of the switch.

2. The amplifier circuit of claim 1, wherein the first stage cancels signal variations of the signal input based on the control input.

3. The amplifier circuit of claim 1, wherein the first stage averages differential input currents of the signal input based on the control input.

4. The amplifier circuit of claim 1, wherein the first stage provides a constant bias current to the first current source driver based on the signal input and the control input.

5. The amplifier circuit of claim 1, wherein the second stage is directly connected to the first stage.

6. The amplifier circuit of claim 1, wherein:
   the first current source driver sources current when operating in the driver mode;
   the second stage further comprises a second current source driver;
   the second current source driver is operable in the constant current source mode or the driver mode; and
   the second current source driver sinks current when operating in the driver mode.

7. The amplifier circuit of claim 6, wherein the first stage comprises:
   a first amplifier that communicates with the first current source driver; and
   a second amplifier that communicates with the second current source driver.

8. The amplifier circuit of claim 6, wherein the first stage comprises:
   a first converter that controls operation of the first current source driver; and
   a second converter that controls operation of the second current source driver.

9. The amplifier circuit of claim 1, wherein:
   the first stage comprises the switch;
   the switch selects the constant current source mode or the driver mode; and
   the switch is connected to the first stage output and to a control input of the second stage.

10. The amplifier circuit of claim 1, further comprising a second current source driver,
    wherein the first stage activates the first current source driver while deactivating the second current source driver.

11. The amplifier circuit of claim 10, wherein the first current source driver operates in a constant current source mode when the second current source driver operates in a driver mode.

12. The amplifier circuit of claim 10, wherein the first current source driver operates in a driver mode when the second current source driver operates in a constant current source mode.

13. The amplifier circuit of claim 10, wherein the first stage enables current flow in the first current source driver while disabling current flow in the second current source driver.

14. An amplifier circuit comprising:
    a first stage to generate a first stage output based on a signal input and a control input;
    a second stage in communication with the first stage output and the control input, the second stage including a first current source driver, wherein the first current source driver is operable in a constant current source mode or a driver mode, and wherein the first current source driver operates in either the constant current source mode or the driver mode based on the signal input and the control input;
    a first comparator circuit that has a first comparator output;
    a second comparator circuit that has a second comparator output; and
    a second current source driver,
    wherein the first current source driver that operates based on the first comparator output, and the second current source driver operates based on the second comparator output.

15. The amplifier circuit of claim 14, wherein:
    the first current source driver operates in a constant current sourcing mode based on the first comparator output; and
    the second current source driver operates in a constant current sinking mode based on the second comparator output.

16. An amplifier circuit comprising:
    a first stage to generate a first stage output based on a signal input and a control input;
    a second stage in communication with the first stage output and the control input, the second stage including a first current source driver, wherein the first current source driver is operable in a constant current source mode or a driver mode, and wherein the first current source driver operates in either the constant current source mode or the driver mode based on the signal input and the control input;
a comparator circuit that compares current through one of the first current source driver and a second current source driver of the second stage with a reference current; and
a control circuit that generates the control input based on the comparison.

17. The amplifier circuit of claim 16, wherein:
the comparator circuit includes N selectable reference currents, where N is an integer greater than 1; and
the comparator circuit compares the current through the current source driver with a one of the N selectable reference currents based on the control input.

18. The amplifier circuit of claim 16, wherein:
the control circuit comprises a flip flop that communicates with the comparator circuit; and
the first current source driver operates based on an output of the flip flop.

19. The amplifier circuit of claim 16, wherein the control circuit comprises:
a gate that communicates with the comparator circuit; and
a flip flop that communicates with the gate,
wherein the first current source driver operates based on an output of the flip flop.

20. An amplifier circuit comprising:
a first stage to generate a first stage output based on a signal input and a control input; and
a second stage in communication with the first stage output and the control input, the second stage including a first current source driver, wherein the first current source driver is operable in a constant current source mode or a driver mode, wherein the first current source driver operates in either the constant current source mode or the driver mode based on the signal input and the control input,
wherein the first stage comprises:
a first comparator that generates the first stage output based on the signal input and the control input; and
a second comparator that generates another first stage output based on the signal input and another control input, and
wherein the second stage further comprises a second current source driver that operates in a constant current source mode and a driver mode based on the second stage output.

21. The amplifier circuit of claim 1, wherein the first current source driver is not blocked from receiving the signal input when in the driver mode.

22. The amplifier circuit of claim 1, wherein:
the second stage further comprises a second current source driver; and
the first current source driver operates in a constant current source mode when the second current source driver operates in a sink mode.

23. The amplifier circuit of claim 1, wherein the first current source driver operates in a current sourcing mode when the second current source driver operates in a constant current source mode.

24. The amplifier circuit of claim 1, wherein:
the first stage comprises the switch;
the switch selects the constant current source mode or the driver mode; and
the switch is connected between an amplifier of the first stage and one of the first stage output and a control input of the second stage.

25. The amplifier circuit of claim 1, wherein the constant current source mode comprises the first stage supplying a constant voltage to a control input of the second stage.

26. The amplifier circuit of claim 1, wherein the first current source driver operates in either the constant current source mode or the driver mode when the signal input receives an input signal with varying voltage.

27. The amplifier circuit of claim 1, wherein the first stage comprises the switch that is configured to select between the constant current source mode and the driver mode.

* * * * *